United States Patent
Karin et al.

(10) Patent No.: US 11,067,610 B2
(45) Date of Patent: Jul. 20, 2021

(54) PARTIAL DISCHARGE DETECTOR

(71) Applicant: Palo Alto Research Center Incorporated, Palo Alto, CA (US)

(72) Inventors: Todd Karin, Los Gatos, CA (US); Peter Kiesel, Palo Alto, CA (US); Ajay Raghavan, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/235,754

(22) Filed: Dec. 28, 2018

(65) Prior Publication Data

US 2020/0209288 A1  Jul. 2, 2020

(51) Int. Cl.
| | |
|---|---|
| *G01R 19/25* | (2006.01) |
| *G01R 15/16* | (2006.01) |
| *G01R 15/22* | (2006.01) |
| *G01R 19/00* | (2006.01) |
| *G01R 19/252* | (2006.01) |
| *G01R 31/12* | (2020.01) |

(52) U.S. Cl.
CPC ......... *G01R 19/2506* (2013.01); *G01R 15/16* (2013.01); *G01R 15/22* (2013.01); *G01R 19/0053* (2013.01); *G01R 19/0084* (2013.01); *G01R 19/252* (2013.01); *G01R 31/1227* (2013.01)

(58) Field of Classification Search
CPC .... G01R 19/2506; G01R 15/16; G01R 15/22; G01R 19/0053; G01R 19/0084; G01R 19/252; G01R 31/1227
See application file for complete search history.

(56) References Cited

U.S. PATENT DOCUMENTS

| | | | |
|---|---|---|---|
| 4,245,187 A | 1/1981 | Wagner et al. | |
| 4,630,218 A | 12/1986 | Hurley | |
| 5,530,364 A | 6/1996 | Mashikian et al. | |
| 6,172,862 B1 | 1/2001 | Jonnatti et al. | |
| 7,388,384 B2 * | 6/2008 | Kato | G01R 31/085 324/512 |
| 8,711,982 B1 * | 4/2014 | Cai | H03D 1/18 329/362 |
| 9,031,799 B2 | 5/2015 | Bae et al. | |

(Continued)

FOREIGN PATENT DOCUMENTS

| | | |
|---|---|---|
| EP | 0800652 | 10/1997 |
| EP | 1222472 | 7/2002 |

(Continued)

OTHER PUBLICATIONS

English Translation of KR 20150003618 (Year: 2015).*

(Continued)

*Primary Examiner* — Tung X Nguyen
*Assistant Examiner* — Feba Pothen
(74) *Attorney, Agent, or Firm* — Mueting Raasch Group

(57) ABSTRACT

A partial discharge (PD) detection system includes a PD sensor configured to sense a PD event of an electrical system and to generate a sensor signal in response to the PD event. An envelope generator is coupled to receive the sensor signal from the PD sensor. The envelope generator extracts an envelope signal from the sensor signal. A digitizer is configured to convert the envelope signal to a digital representation of the PD event.

24 Claims, 20 Drawing Sheets

(56) References Cited

U.S. PATENT DOCUMENTS

| | | | |
|---|---|---|---|
| 9,482,699 B2 | 11/2016 | Hoffman et al. | |
| 9,838,228 B2 | 12/2017 | Choi et al. | |
| 9,967,939 B2 | 5/2018 | Bandel et al. | |
| 9,976,989 B2 | 5/2018 | Dehghan Niri et al. | |
| 2002/0093319 A1* | 7/2002 | Ball | G05F 1/565 323/282 |
| 2002/0131114 A1* | 9/2002 | Yoo | H01R 13/53 398/84 |
| 2005/0243649 A1* | 11/2005 | Kuppuswamy | G01R 31/1209 367/118 |
| 2008/0120053 A1* | 5/2008 | Pupalaikis | G01R 23/16 702/79 |
| 2016/0377530 A1* | 12/2016 | Barrett | G01J 3/108 250/564 |
| 2019/0082521 A1* | 3/2019 | Burchardt | H05B 45/395 |
| 2019/0383872 A1 | 12/2019 | Andle et al. | |

FOREIGN PATENT DOCUMENTS

| | | |
|---|---|---|
| JP | S55152474 | 11/1980 |
| JP | H07107627 | 4/1995 |
| JP | H11174111 | 7/1999 |
| JP | 2000346901 | 12/2000 |
| JP | 2002148301 | 5/2002 |
| KR | 20150003618 | 1/2015 |
| WO | 96/20410 | 7/1996 |
| WO | 01/18554 | 3/2001 |

OTHER PUBLICATIONS

IEEE Power & Energy Society, "IEEE Recommended Practice for Partial Discharge Measurement in Liquid-Filled Power Transformers and Shunt Reactors", Aug. 20, 2010 47 pages.

Mohammadi et al., "Distributed Capacitive Sensors for Partial Discharge Detection and Defective Region Identification in Power Transformers", IEEE Sensors Journal, vol. 17, No. 6, Mar. 15, 2017, pp. 1626-1634.

European Search Report from EP Application No. 19219900.8 dated May 15, 2020, 12 pages.

File History for U.S. Appl. No. 16/235,747.

European Search Report from EP Application No. 19219906.5 dated May 27, 2020, 10 pages.

Zaeni et al., "Designing, Simulating and Manufacturing Envelope Detector to Analyze Partial Discharge Waveform", Proceedings of the Joint International Conference on Electric Vehicular Technology and Industrial, Mechanical, Electrical, and Chemical Engineering, Nov. 4, 2015, pp. 94-99.

* cited by examiner

PARTIAL DISCHARGE DETECTOR

STATEMENT REGARDING FEDERALLY SPONSORED RESEARCH AND DEVELOPMENT

This invention is based on work supported by the U.S. Department of Energy (DOE)/Office of Electricity through the DOE National Energy Technology Laboratory under award agreement #DE-OE0000872. The Government has certain rights to this invention.

BACKGROUND

Partial discharge (PD) is a small electrical spark occurring in the insulation or near an electrode of an electrical device. Partial discharge is distinct from arcing because the path of the discharge does not reach from one conductor to another or to ground. Partial discharge monitoring can be an important tool to detect degradation of electrical devices. The presence of PD can signify insulation degradation, loose connections, moisture ingress, high voltage in unintended locations, or other issues.

BRIEF SUMMARY

Some embodiments involve a partial discharge (PD) detection system. The system includes a PD sensor configured to sense a PD event of an electrical system and to generate a sensor signal in response to the PD event. An envelope generator is coupled to receive the sensor signal from the PD sensor. The envelope generator is configured to extract an envelope signal of the sensor signal. A digitizer is configured to convert the envelope signal to a digital representation of the PD event.

Some embodiments are directed to a method of detecting a PD event. The method includes sensing a PD event of an electrical system and generating an electrical sensor signal in response to the PD event. An envelope signal is extracted from the sensor signal and is converted to a digital representation of the envelope signal.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Although partial discharge (PD) is more likely to occur in high voltage components, e.g., components having operating voltages greater than about 1000 volts, PD can also affect lower voltage components. Partial discharge sites may correspond to locations where imperfections in the insulation of an electrical device are present. Monitoring a device for PD allows early warning that the device needs to be repaired before more serious failures occur. Partial discharge (PD) events are localized electrical discharges that only partially bridge the insulation between conductors or between a conductor and ground. Each PD event produces a high frequency electrical signal that can be sensed.

Some embodiments discussed herein are directed to monitoring an electrical device for the occurrence of partial discharge events. The electrical device is an electrically connected component of an electrical system. In one example, the electrical system includes the electrical device, e.g., a transformer, and a connector that connects the transformer to the electrical power grid or to another electrical device.

Figure 1:
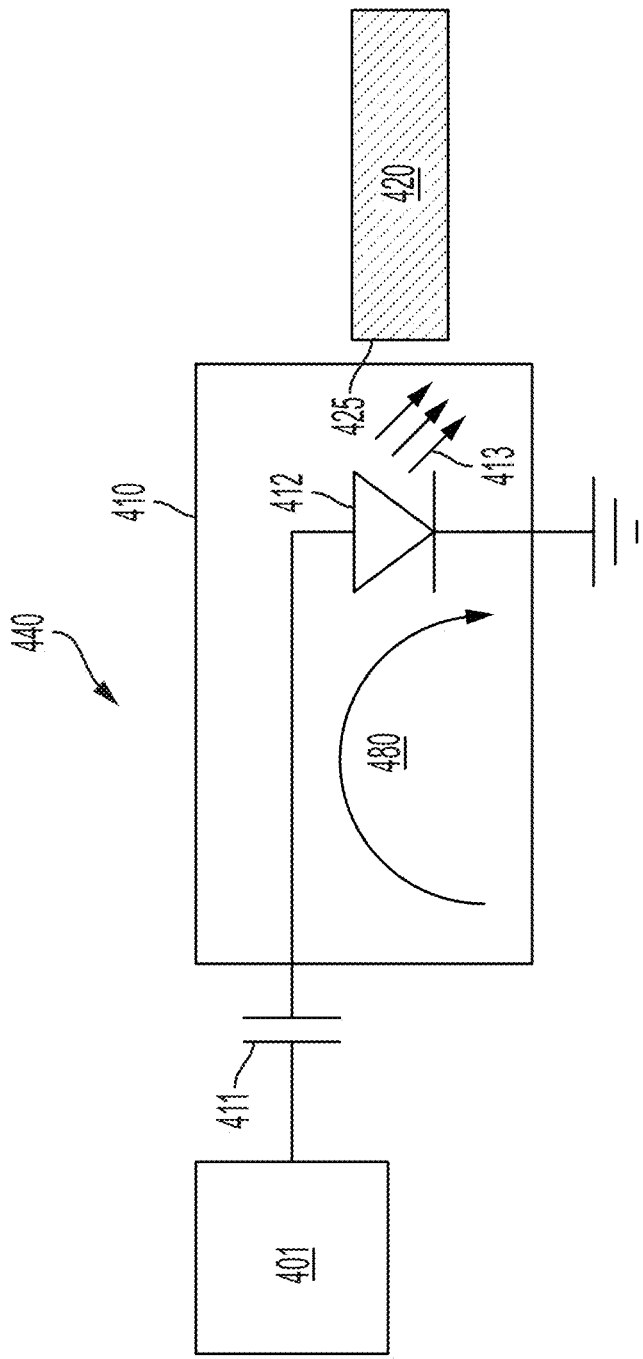
FIGS. 1-4 are schematic diagrams of PD detection circuitry comprising electrical-optical transducers in accordance with various embodiments.

Some embodiments discussed herein are directed to PD detection circuitry that includes an electrical-optical transducer. FIG. 1 is a schematic diagram of a PD detection circuitry 440 comprising electrical-optical transducer 410 configured to convert the electrical sensor signal from a PD sensor 411 to a light signal. In general, the PD sensor 411 may be any type of PD sensor. For example, the PD sensor 411 may be or comprise a capacitive coupling sensor. The PD sensor 411 may be or comprise a transient earth voltage sensor, or a high frequency coupling capacitor. The transducer 410 comprises a light emitting device (LED) 412 in series with the PD sensor 411. In some embodiments there may also be included a current limiting resistor either in series or in parallel with the LED 412.

The LED 412 may comprise a light emitting diode or laser, for example. The PD sensor 411 generates an electrical signal that causes a current to flow in the loop indicated by arrow 480. The electrical signal drives the LED 412 which generates an analog light signal 413 indicative of the PD event in response to the electrical signal. The LED 412 may be optically coupled to an optical fiber 420 arranged to carry the analog light signal 413 to a remote location for further processing. In some embodiments, the transducer 410 and input end 425 of the optical fiber 420 are disposed at the location of the monitored electrical component 401 and further processing to detect the occurrence of the PD event and/or to extract information about the occurrence of PD events at the remote location.

In some embodiments, the information about the PD event may be carried through the optical fiber 420 by the analog light signal 413 as in FIG. 1. In other embodiments the light signal is re-converted to an electrical signal and the electrical signal carries the information indicative of the PD event to the remote location. For example, the analog light signal 413 may be converted to an electrical signal by a photodetector, and the electrical signal may be processed, e.g., by filtering, amplification and/or analog to digital (A/D) conversion. The circuitry that implements the filtering, amplification, and A/D conversion can be disposed at the location of the monitored component 401. In some embodiments, the digitized electrical signal may be re-converted to a digital light signal before the digital light signal is coupled into an optical fiber. In such an embodiment, the digital light signal carries the information about the PD event from the monitored electrical component to the remote location.

Figure 2:
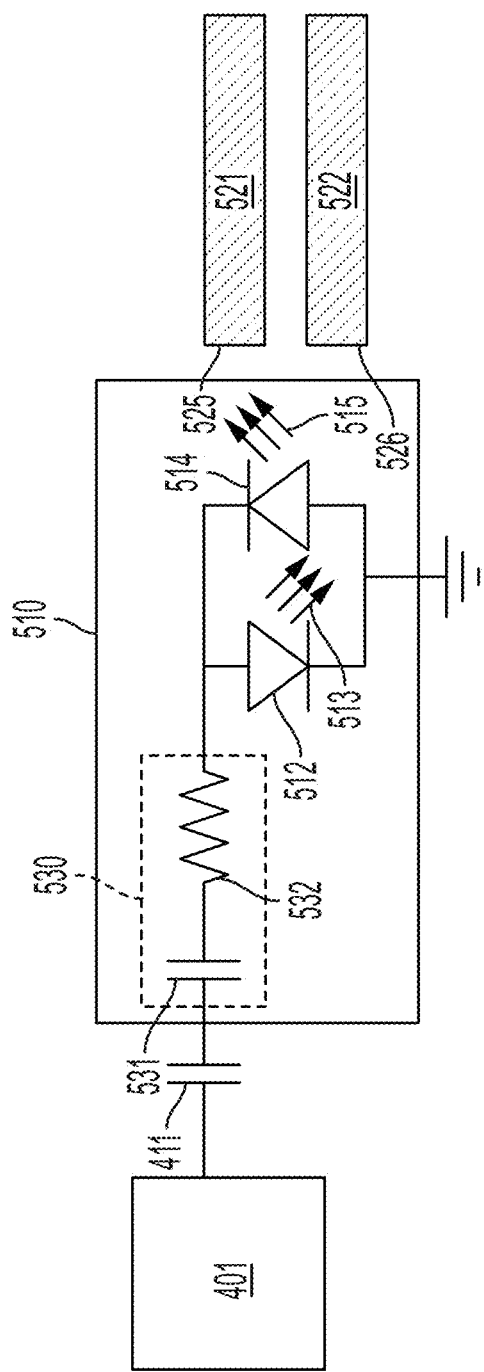

FIG. 2 is a schematic diagram of another version of an electrical-optical transducer 510 in accordance with some embodiments. In this example, the transducer 510 optionally includes a high pass filter 530. In the embodiment shown in FIG. 2, the high pass filter 530 includes a capacitor 531 and resistor 532 connected in series. The high pass filter 530 attenuates low frequencies in the electrical sensor signal. The resistance 532 is selected to limit current to the LEDs 512, 514.

First and second LEDs 512, 514 are arranged with opposite polarity and in parallel with each other. The first and second LEDs 512, 514 convert the electrical signal generated by the PD sensor 411 into light signals 513, 515. The first LED 512 generates a first analog light signal 513 in response to the positive-going portion of the sensor signal and the second LED 514 generates a second analog light signal 515 in response to the negative-going portion of the sensor signal.

The voltage fluctuation caused by partial discharge events are typically quite fast (oscillating with tens of ns). Recording such a fast signal requires costly data acquisition cards. Adding low pass filtering in the LED circuit results in generated slow light pulses (0.5 μsec to few μsec) that can be recorded with lower cost components. In some embodiments, the LEDs 512, 514 can be selected such that the response times of the LEDs 512, 514 provide low pass filtering of the sensor signals. For example, in some implementations, acceptable low pass filtering of the sensor signal can be achieved when the LEDs 512, 514 have rise and fall times of about 5 ns. Alternatively, a low pass filter can be added to the circuit.

LEDs 512, 514 can be respectively optically coupled to corresponding first and second optical fibers 521, 522. LED 512 is optically coupled to optical fiber 521 and LED 514 is optically coupled to optical fiber 522. In some embodiments, the transducer 510 and input ends 525, 526 of the optical fibers 521, 522 are located at the monitored electrical device 401. The optical fibers 521, 522 extend to carry the first and second analog light signals 513, 515 to a remote location for further processing. The optical interconnect comprising the LEDs and the optical fibers provides a signal pathway with good electrical isolation and low electromagnetic interference between the monitored component and the remote location where the optical signal is received and processed.

As discussed above, in some embodiments, the information about the PD event may be carried through the optical fibers 521, 522 by the analog light signals 513, 515. In other embodiments the light signals 513, 515 are converted to electrical signals at the location of the monitored electrical device 401 and the electrical signals carry the information indicative of the PD to the remote location as previously discussed.

Figure 3:
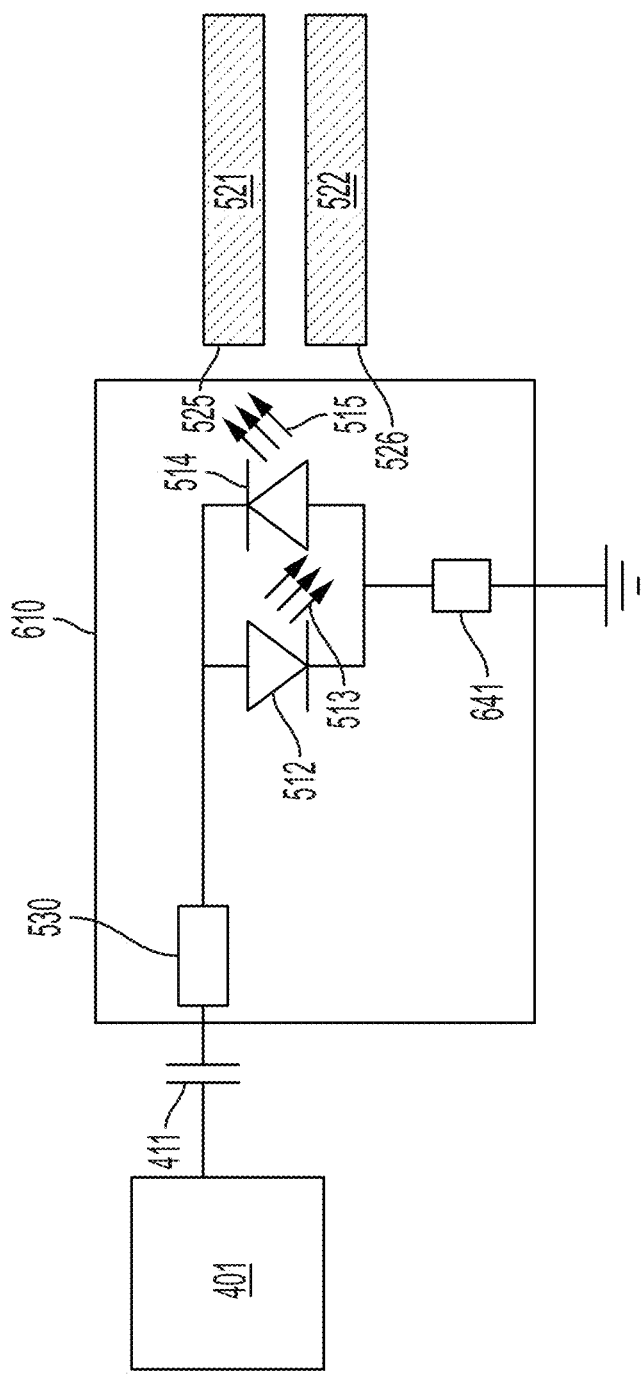

For the direct electrical to optical transducers shown in FIGS. 1, 2, and 3 in which LEDs are connected to the PD sensor without an active device such as an op-amp interposed between the LEDs and the sensor, PD events that generate a voltage smaller than the LED's turn-on voltage will not produce an optical signal. This can however be tuned by changing the high-pass filter characteristics in order to couple in some of the 60 Hz (base) frequency. This 60 Hz base frequency can be used to bias the LED so that even small events are transduced into an optical signal. It is also possible to use an LED with a lower turn-on voltage in order to increase the sensitivity of the device.

FIG. 3 illustrates an embodiment of an electrical-optical transducer 610 for PD detection. Transducer 610 has many of the same components previously discussed in conjunction with transducer 510. Transducer 610 additionally comprises a rectifier/regulator 641 connected between the LEDs 512, 514 and ground, bringing the effective turn-on voltage of the LEDs 512, 514 to about 0 V. In the configuration shown in FIG. 3, the inclusion of the rectifier/regulator 641 makes it possible to measure charge less than about 1 nC, allowing even a small PD to produce an optical output from the LEDs 512, 514. Rectifier/regulator 641 may have a connection to voltage input 411 so that the voltage across the LED is only related to the high-frequency components of input signal 411.

Figure 4:
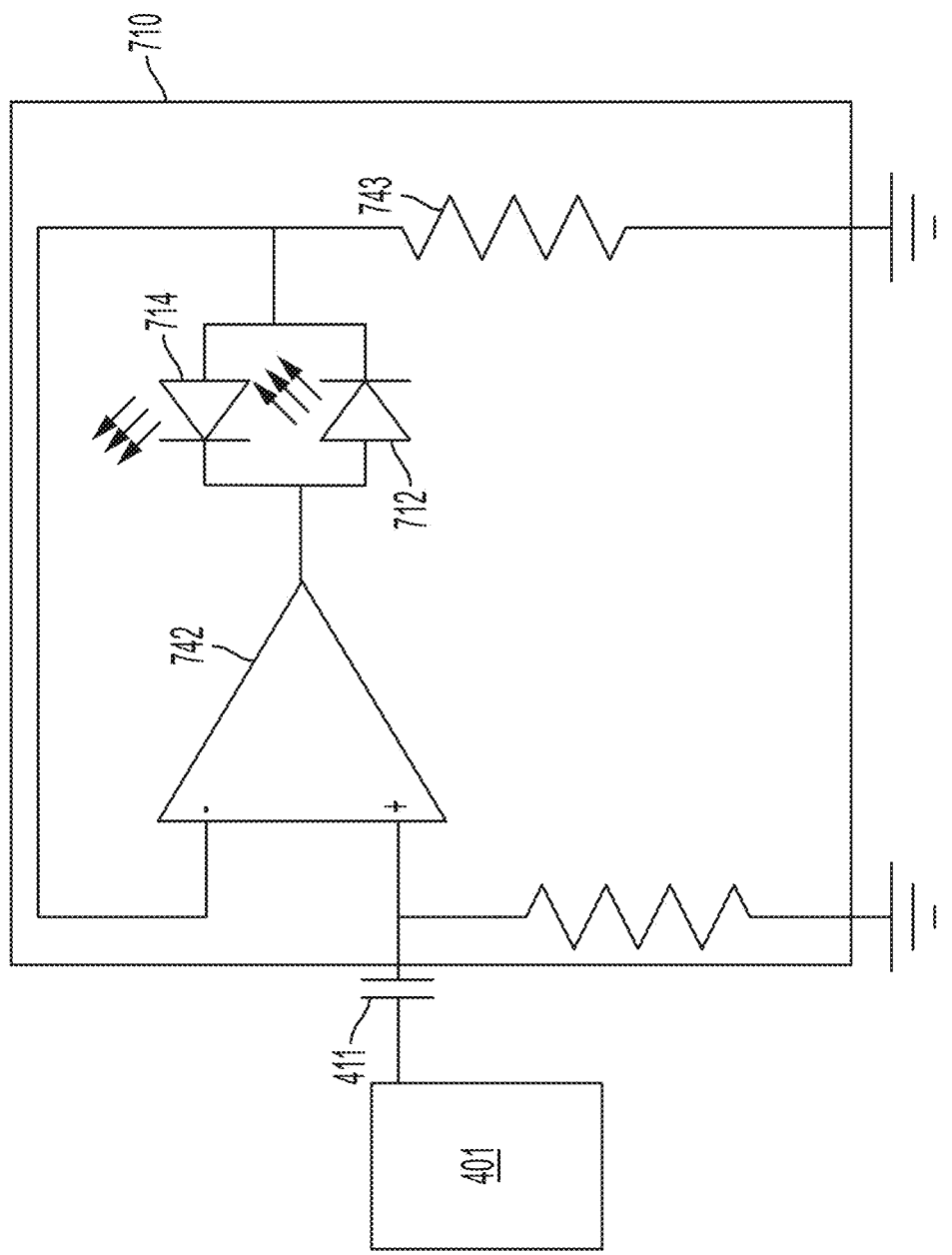

FIG. 4 illustrates another implementation of an electrical-optical transducer 710 for detecting PD events of a monitored electrical component 401. Transducer 710 includes an operational amplifier 742 coupled between the PD sensor 411 and LEDs 712, 714 which are arranged with opposite polarity and in parallel. The resistor 743 is selected to limit current to the LEDs 712, 714. Using an amplifier 742 between the PD sensor 411 and the LEDs 712, 714 (compared to the direct-to-LED method) provides an output optical power that is linear with PD charge. Using this technique, small PD events can generate a measurable optical signal.

Figure 5:
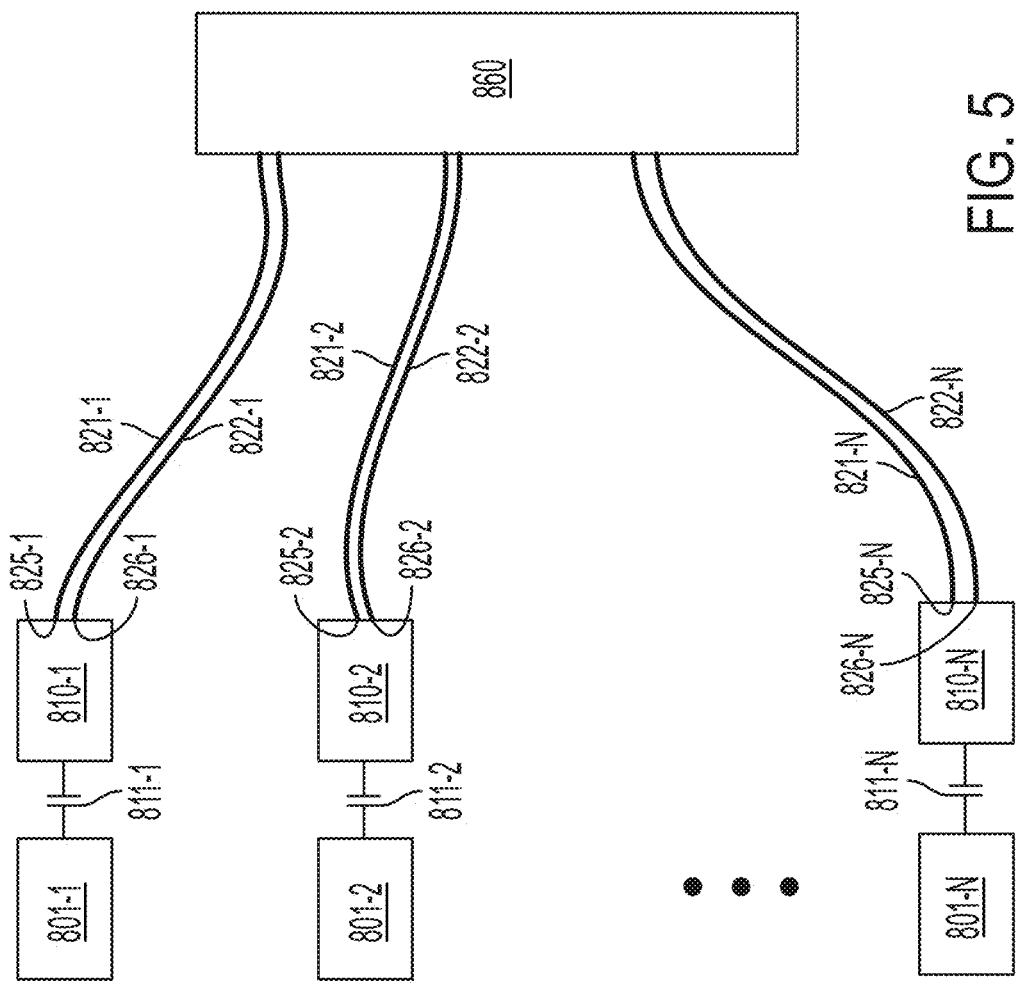
FIG. 5 schematically depicts a PD monitoring system comprising N PD sensors and N electrical to optical transducers in accordance with some embodiments.

According to some implementations, a PD monitoring system can include multiple PD transducers as discussed above positioned on a single component to monitor multiple locations of the component or positioned on multiple components. FIG. 5 schematically depicts a PD monitoring system comprising N PD sensors, 811-1, 811-2, through 811-N, and N electrical to optical transducers 810-1, 810-2 through 810-N. Each PD transducer 810-1, 810-2, through 810-N is respectively positioned in proximity to a corresponding electrical component 801-1, 801-2, through 801-N. PD sensors 811-1, 811-2, 811-N are respectively coupled to components 801-1, 801-2, 801-N to sense PD events of the components 801-1, 801-2, 801-N. The sensor outputs of PD sensors 811-1, 811-2, 811-N are respectively coupled to the PD transducers 810-1, 810-2, 810-N.

Each PD transducer 810-1, 810-2, through 810-N illustrated in this embodiment includes two LEDs as previously discussed in connection with FIG. 3 or 4. Each LED is optically coupled to an optical fiber 821-1, 822-1, 821-2, 822-2 through 821-N, 822-N. The PD transducers 810-1, 810-2 through 810-N and the input ends 825-1, 826-1, 825-2, 826-2, through 825-N, 826-N of the optical fibers 821-1, 822-1, 821-2, 822-2 through 821-N, 822-N are positioned in close proximity to the monitored component 801-1, 801-2, through 801-N. The optical fibers 821-1, 822-1, 821-2, 822-2 through 821-N, 822-N carry light signals that include information about PD events of the monitored components 801-1, 801-2, through 801-N to central processing circuitry 860 where the light signals are converted to electrical signals and processed to extract the PD information.

Figure 6:
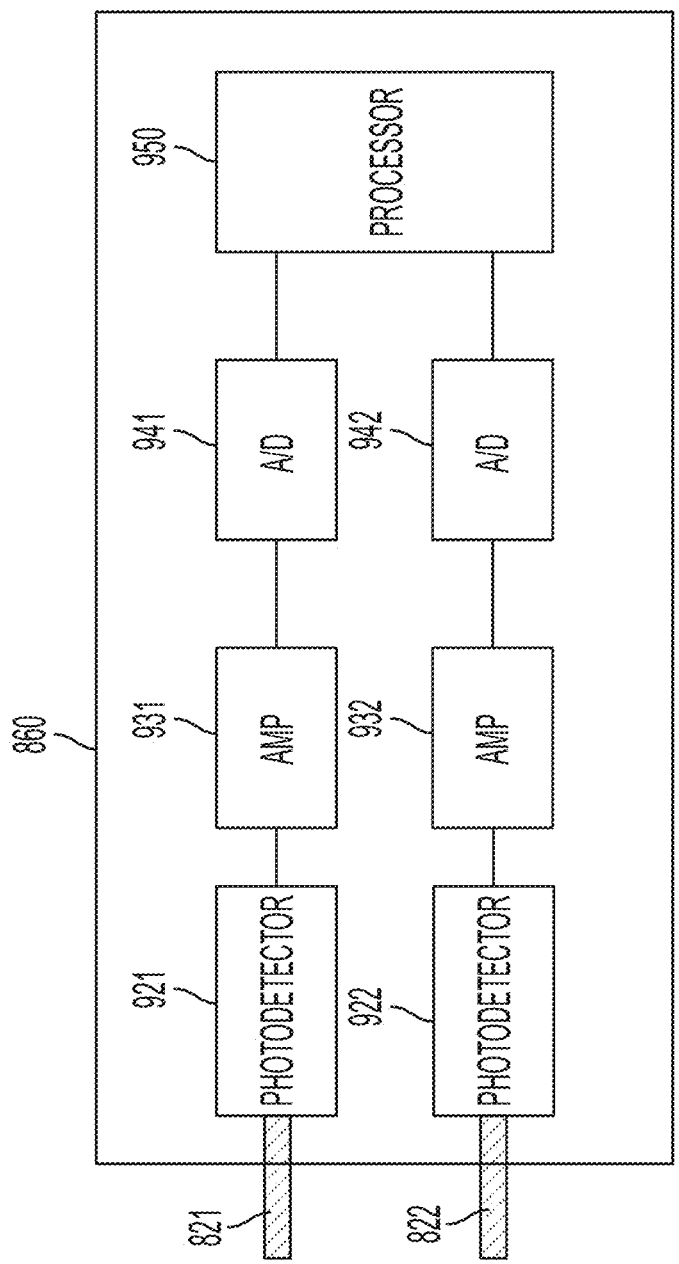
FIG. 6 is a block diagram illustrating a representative embodiment of a portion of the central processing circuitry in accordance with some embodiments.

FIG. 6 is a block diagram illustrating a representative embodiment of a portion of the central processing circuitry 860 in more detail. The portion of the central processing circuitry shown in FIG. 6 includes first and second photodetectors 921, 922 respectively optically coupled to the output ends of optical fibers 821, 822. Optical fibers 821, 822 carry the light signals, e.g., analog light signals from first and second LEDs of a PD transducer located at the component being monitored for PD. The photodetectors 921, 922 receive the light signals and convert them into electrical signals. For example, each photodetector may comprise a silicon p-i-n diode, a silicon photomultiplier or other types of photodetectors. After the optical to electrical conversion, the electrical signals from each photodetector 921, 922 are amplified, e.g., by transimpedance amplifiers 931, 932 which are implemented using an operational amplifier. The amplified electrical signals are then digitized by A/D converters 941, 942 and the digitized signals are provided to circuitry 950 configured to extract the PD information from the digitized signals. In some embodiments the circuitry comprises a processor that executes stored program instructions to extract the PD information from the digitized signals. Additional signal processing may be implemented anywhere along the communication link between the PD transducer and the central processing circuitry 950 and/or by the processing circuitry 950.

Partial discharge events vary in total charge and it may be useful to determine the total charge (measured in Coulombs) transferred in a PD event. Larger-charge PD events typically signify greater damage or voltage stress on the electrical device. For AC systems, the phase-angles where PD occurs also can be used to identify problems in medium-voltage and high-voltage components.

The magnitude of a PD event can be characterized by the amount of charge at the PD sensor. The amount of charge of the PD event is related to the magnitude of the PD sensor signal. The conversion of sensor signal magnitude to PD event charge can be obtained through a calibration technique implemented by the partial discharge detection processor in which a known charge is injected into the electrical device when the electrical device is turned off.

If the sensor signal is used to drive LEDs directly (e.g., without an amplifier interposed between the PD sensor and the LEDs as in the configurations of FIGS. 1, 2, 3) then the PD charge is not linearly related to the measured voltage. However, the PD charge can be calculated given the known voltage magnitude/shape of the event on both LEDs. The optical signals, transduced back to electrical signals using a photodiode, may be combined using a two-dimensional fit or a formula for determining the charge.

In some embodiments, a PD event processor may be configured to detect degradation of the electrical system based on PD event signals. For example, the processor may store information obtained from the PD event signals taken at different points in time. The processor may compare the information from successive PD events to determine that the electrical system is changing, e.g., degrading with time. In one scenario, the processor may obtain the magnitude of the PD charge signal and/or total charge transferred for successive PD events. If the magnitude of the PD charge signals and/or a rate at which they are increasing over time, the processor may trigger an alert or notification allowing operators to take action before a catastrophic failure occurs. In another scenario, the processor may obtain a first signature (e.g., a snapshot) of the PD sensor signal (or other signal) corresponding to the PD event at a first point in time and compare the first signature to a second signature obtained from a PD event that occurs at a second point in time. The processor may compare morphology, magnitude, timing, envelope rise time, envelope fall, time, and/or other parameters of the first and second signatures to detect changes in the electrical system. If the changes in the signal signature indicate degradation, the processor may trigger an alert or notification responsive to the signal signature changes allowing operators to take appropriate action. According to some embodiments, the processor may be configured to predict a time of failure of the monitored electrical system based on recent usage trends and/or load pattern trends.

One difficulty with partial discharge detection is that fast data acquisition devices (faster than 100 million samples per second) are typically required in order to accurately record the PD signal. These fast data acquisition devices are expensive. Embodiments discussed herein are directed to detectors and methods for recording high-frequency PD signals (e.g. >20 MHz) on a lower frequency (e.g. 2 MHz) digitizer. Some approaches described herein involve extracting the envelope of the signal of the PD event. The envelope of the PD signal can be digitized using a less expensive, lower frequency digitizer than the PD signal itself.

A signal from a partial discharge sensor, for example a capacitive sensor, a transient earth voltage probe, high-frequency current transformer or high-frequency antenna, may be used to pick up the electrical signal of the PD events. Some PD sensors, e.g., a capacitive sensor and/or current transformers, may be able to also detect the base operating frequency of the monitored electrical system in the case that the power is AC. In some scenarios, e.g. with high-voltage DC transmission, there is no intended "base" frequency, but it may be desirable to record the low frequency component of such signals in order to check for oscillations and/or other signal anomalies.

Figure 8A:
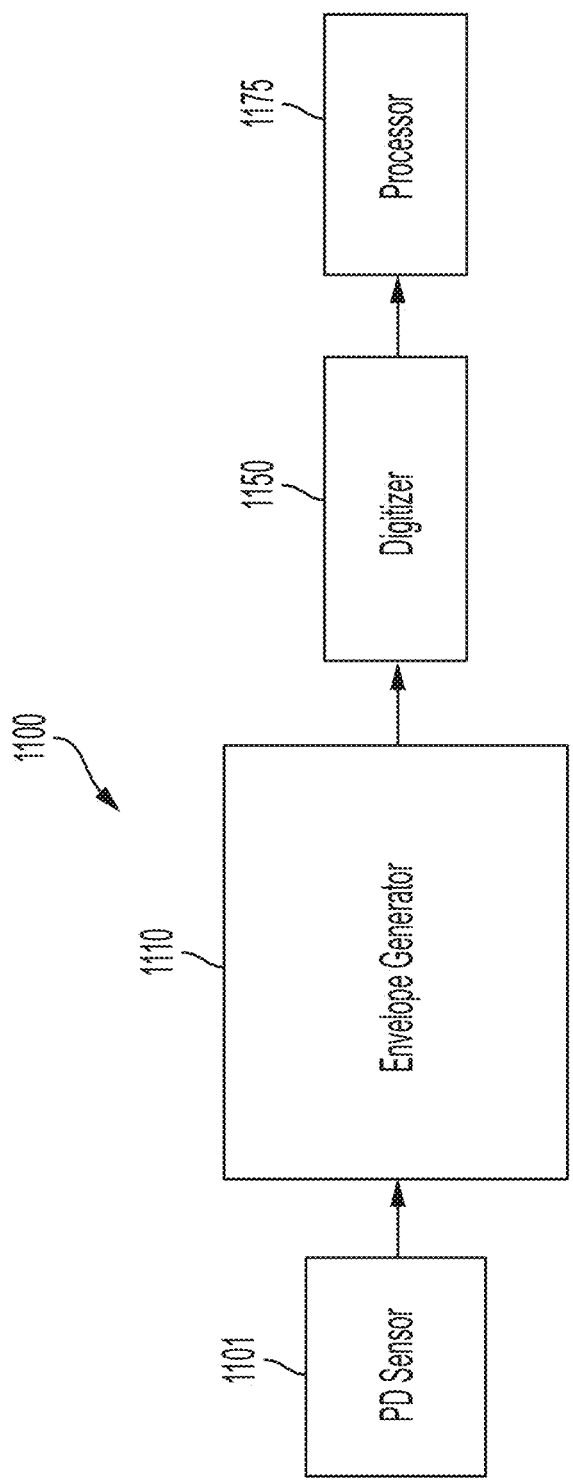
FIG. 8A shows a block diagram of partial discharge system in accordance with some embodiments.
Figure 9:
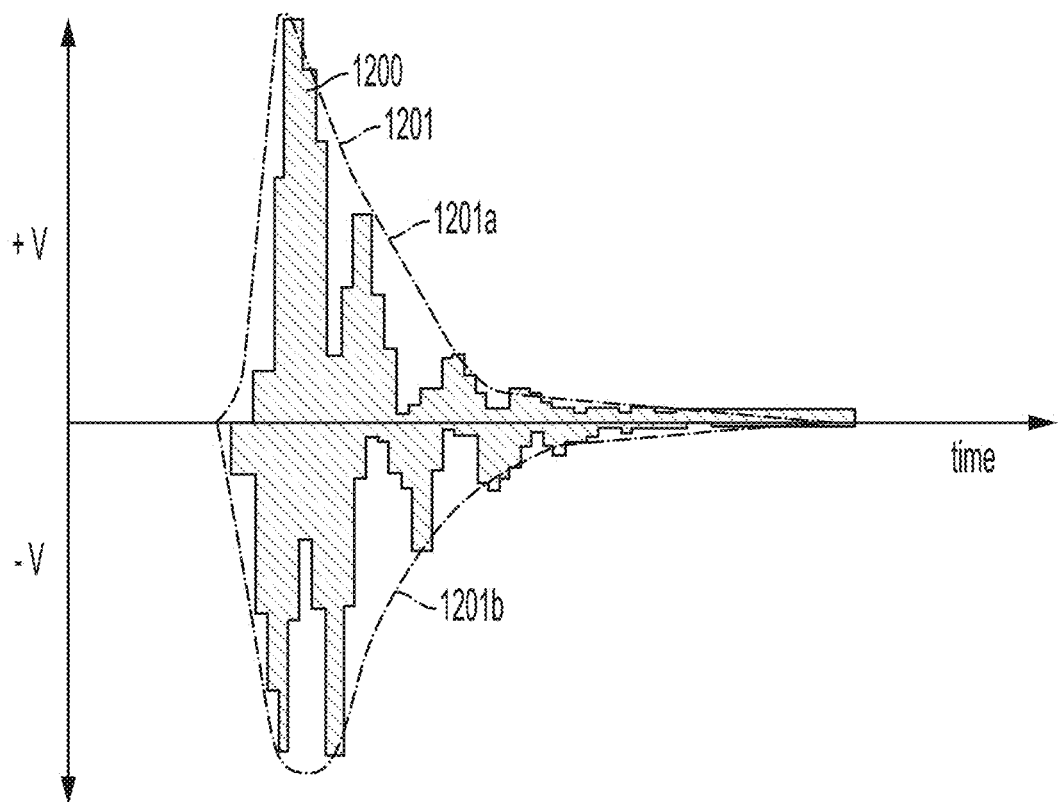
FIG. 9 shows a PD sensor signal and the envelope of the PD signal.

FIG. 8A shows a block diagram of partial discharge system 1100 in accordance with some embodiments. The system comprises a partial discharge (PD) sensor 1101 configured to sense a PD event of an electrical system and to generate a sensor signal in response to the PD event. The PD sensor 1101 may comprise one or more of a coupling capacitor, a transient earth voltage sensor, a current transformer and an antenna. As depicted in FIG. 9, the PD sensor signal 1200 is a relatively high frequency signal, e.g., having frequency components on the order of 10 s of MHz, for example. The envelope 1201 of the PD signal 1200 is a curve that has a positive-going portion 1201a that joins the positive going peaks of the PD signal and a negative going portion 1201b that joins the negative going peaks. The highest frequency components of the envelope signal 1201 may be less than 1 MHz, or less than 100 KHz, for example.

An envelope generator 1110 is coupled to receive the sensor signal from the PD sensor 1101. The envelope generator 1110 extracts the envelope signal from the sensor signal. The envelope generator 1110 may extract the envelope signal from one or both of a positive-going portion of the sensor signal and a negative-going portion of the sensor signal.

A digitizer 1150 is coupled to the envelope generator 1110 and is configured to convert the envelope signal to a digital representation of the envelope signal. In some embodiments, the bandwidth of the digitizer 1150 may be less than about ⅕ or even less than about 1/10 the desired frequency component to be measured. The output of the digitizer may be provided to a processor 1175 that is configured to analyze the envelope signal to determine characteristics of the PD event. For example, the processor 1175 may determine the total charge transferred during the PD event. In some embodiments, the processor 1175 may store information obtained from envelope signals taken at different points in time. The processor 1175 may compare the information from envelope signals obtained from successive PD events to determine that the electrical system is degrading or otherwise changing over time. For example, the processor may obtain the magnitude of the envelope signal and/or the total charge transferred for successive PD events. If the magnitude of the envelope signal, the phase-resolved PD pattern, and/or the total charge transferred is increasing over time, the processor 1175 may trigger an alert or notification responsive to the increasing envelope signal magnitude and/or total charge transferred, allowing operators to take action before a catastrophic failure occurs. In another scenario, the processor may obtain a first signature (e.g., a snapshot) of the envelope signal during a first PD event at a first point in time and compare the first signature to a second signature during a second PD event obtained at a second point in time. The processor 1175 may compare morphology, magnitude, envelope timing, rise time, envelope fall time, and/or other parameters of the first and second signatures to detect changes in the electrical system. If the changes in the signal signature are consistent with degradation, the processor 1175 may trigger an alert or notification responsive to signal signature changes allowing operators to take appropriate action.

Higher usage and/or higher loading of the electrical system correlate to PD events that occur at higher frequency, have higher magnitude, produce a greater total charge transferred, and/or have other characteristics that indicate usage and/or loading of the system. According to some embodiments, the processor 1175 may keep track of these PD event characteristics and determine the usage and/or loading of the electrical system over time. In some implementations, the processor can predict a time to failure for the electrical system based on the usage and/or loading trends of the system and/or on characteristics of the PD events.

Figure 8B:
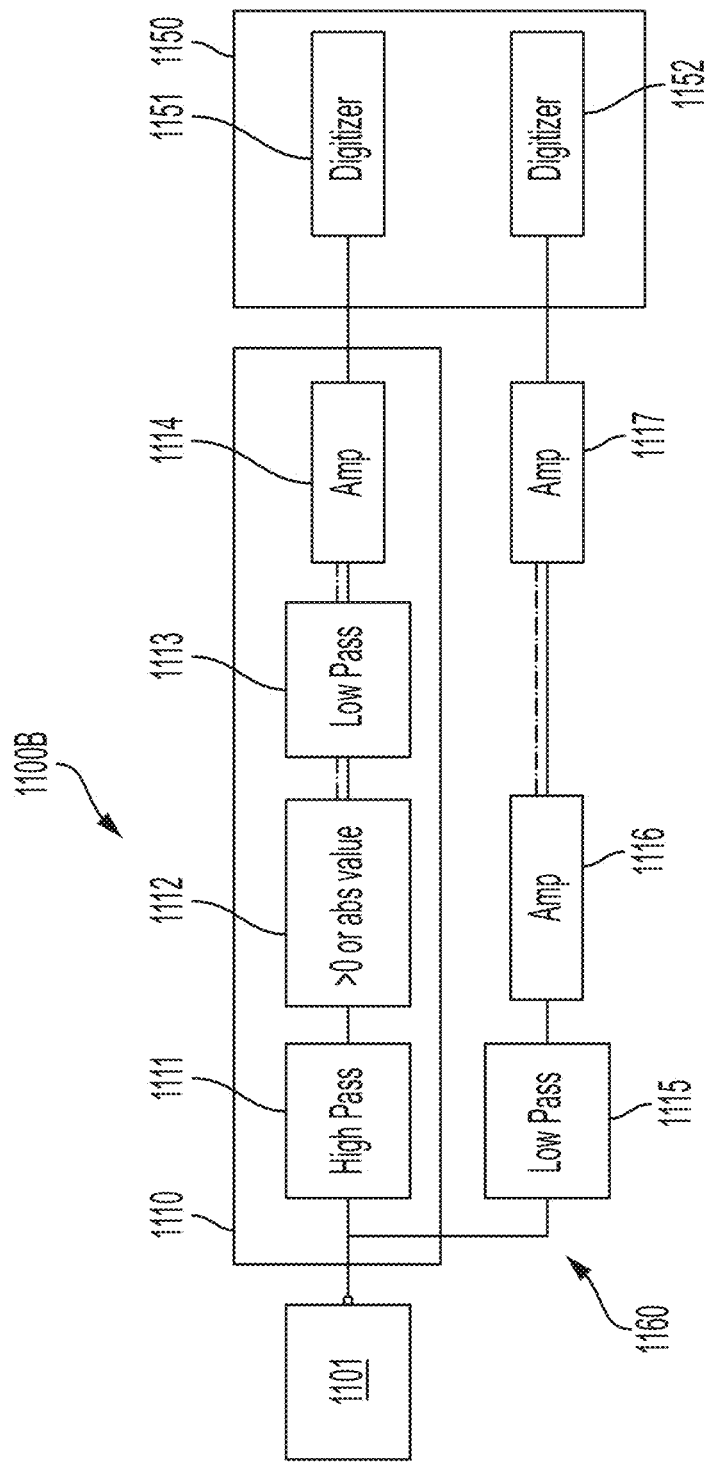
FIG. 8B provides a more detailed block diagram of a PD detection system in accordance with some embodiments.

FIG. 8B provides a more detailed block diagram of a PD detection system 1100B in accordance with some embodiments. The PD sensor 1101 provides an electrical signal responsive to a PD event of a monitored electrical system. As illustrated in FIG. 8B, the envelope generator 1110 includes a high pass filter coupled to the PD sensor. The high pass filter 1111 may have a cut off frequency such that frequencies less than about 50 kHz in the electrical PD sensor signal are substantially attenuated by the filter 1111. For example, when monitoring an AC electrical system for PD events, the high pass filter 1111 would typically block the line frequency. The envelope generator 1110 can include rectifier circuitry 1112 that 1) blocks the negative-going portion and passes the positive-going portion of the signal at the output of the high pass filter 1111; 2) blocks the positive-going portion and passes the negative-going portion of the signal at the output of the high pass filter 1111; and/or 3) provides the absolute value of the positive-going and negative-going portions of the signal at the output of the high pass filter 1111. The output of the rectifier circuitry 1112 is coupled to a low pass filter 1113 that attenuates high frequency components from the rectified signal, providing the envelope signal at the output of the low pass filter 1113. The envelope generator 1110 optionally includes an amplifier 1114 that amplifies the envelope signal. The envelope signal is converted from an analog signal to a digital signal by digitizer element 1151 of the digitizer 1150. Optionally, the electrical signal at the output of the rectifier 1112 may be converted to an optical signal and the optical signal may be re-converted to an electrical signal prior to amplification by amplifier 1114. Optical signals may be desirable for electrical isolation or electromagnetic interference reduction in some implementations.

In some embodiments, the cut off frequencies of the high pass 1111 and/or low pass 1113 filters can be tunable. Tunable filters allow the spectrum of PD signal amplitudes at different frequencies to be produced. Tunable filters can also be used to choose a specific measurement band, thus avoiding picking up environmental background noise, such as radio frequency signals, PD from other sources, etc., and increasing the sensitivity of the PD detection system.

In some embodiments, the PD detection system 1100B can optionally include a channel 1160 that detects the operational frequency of a monitored AC electrical system. Channel 1160 includes a low pass filter 1115 that substantially attenuates frequencies that are above, e.g., 10 times, 100 times, 1000 times, the operating frequency of the AC system being monitored for PD events while passing frequencies that are below operating frequency of the monitored AC system. The filtered signal may be amplified by amplifier components 1116 and/or 1117. In some embodiments, the signal between amplifier 1116 and 1117 may be an electrical signal. In other embodiments, the output of amplifier 1116 may be converted to an optical signal and reconverted to an electrical signal before the input of amplifier 1117. The output of amplifier 1117 is converted from an analog signal to a digital signal by digitizer component 1152. By detecting the base frequency, the phase angle of a detected PD event can be easily recorded using the same digitizer.

The output of the digitizer components 1151, 1152 may be coupled to a processor (not shown in FIG. 8B). The processor can be configured to analyze the envelope signal, e.g., as further described in connection with FIG. 8A.

FIGS. 10 through 15 provide simplified schematic diagrams of several PD detection systems in accordance with various embodiments. The schematic arrangements shown in FIGS. 10 through 15 provide just a few of many circuit implementations for achieving PD detection systems that down-convert the frequency of the PD signal to a lower frequency envelope signal which can be more cost effectively digitized and analyzed in accordance with approaches described herein.

Figure 10:
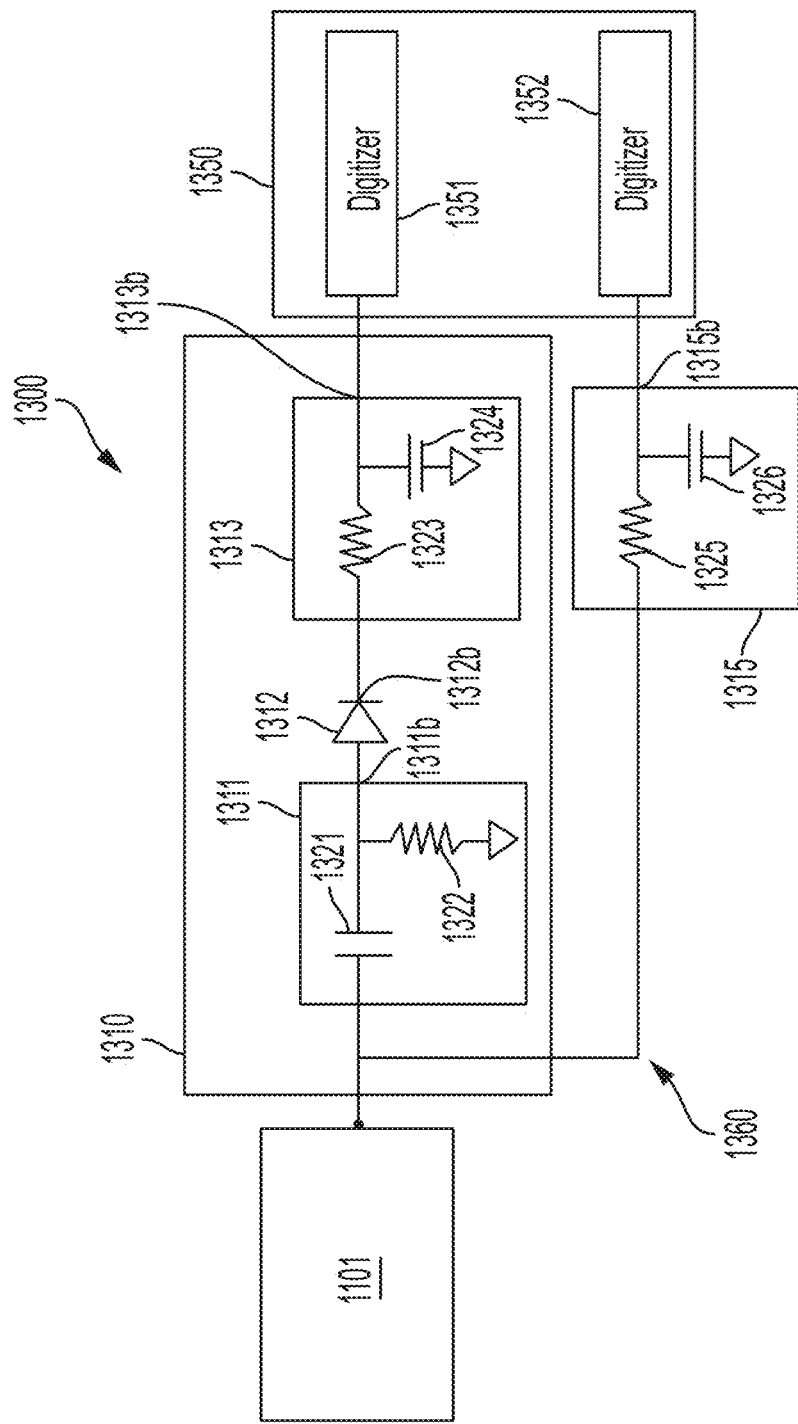
FIG. 10 is a simplified schematic of a PD detection system comprising a single sided direct electrical envelope generator in accordance with some embodiments.

FIG. 10 is a simplified schematic of a PD detection system 1300 comprising a single sided direct electrical envelope generator 1310 in accordance with some embodiments. The PD sensor 1101 provides an electrical signal responsive to a PD event of a monitored electrical system. As illustrated in FIG. 10, the envelope generator 1310 includes a high pass filter 1311 a coupled to the PD sensor 1101. In FIG. 10, the high pass filter 1311 is depicted as a passive filter comprising a capacitor 1321 and a resistor 1322, however it will be appreciated that other types of high pass filter circuits may be used. The envelope generator 1310 includes rectifier circuitry 1312 illustrated as a diode that is arranged to block the negative-going portion and to pass the positive-going portion of the signal at the output 1311b of the high pass filter 1311. The output 1312b of the rectifier circuitry 1312 is coupled to a low pass filter 1313 that attenuates high frequency components from the rectified signal, providing the envelope signal at the output 1313b of the low pass filter 1313. In FIG. 10, the low pass filter 1313 is depicted as a passive filter comprising a capacitor 1324 and a resistor 1323, however it will be appreciated that other types of low pass filter circuits may be used. The envelope signal is converted from an analog signal to a digital signal by digitizer component 1351 of digitizer 1350.

In some embodiments, the cut off frequencies of the high pass 1311 and/or low pass 1313 filters can be tunable. Tunable filters allow the spectrum of PD signal amplitudes at different frequencies to be produced. Tunable filters can also be used to avoid picking up environmental background noise, such as radio frequency signals, PD from other sources, etc., thus increasing the sensitivity of the PD detection system.

In some embodiments, the PD detection system 1300 can optionally include a second channel 1360 that detects the operating frequency of a monitored AC electrical system. Channel 1360 includes a low pass filter 1315 that substantially attenuates frequencies that are above, e.g., 10 times, 100 times, 1000 times, the operating frequency while passing frequencies that are below operating frequency of the electrical system. In FIG. 10, the low pass filter 1315 is depicted as a passive filter comprising a capacitor 1325 and a resistor 1326, however it will be appreciated that other types of low pass filter circuits may be used. The output 1315b of the low pass filter 1315 is converted from an analog signal to a digital signal by digitizer component 1352. The output of the digitizer components 1351, 1352 may be coupled to a processor (not shown in FIG. 10). The processor can be configured to analyze the envelope signal, e.g., as further described in connection with FIG. 8A.

Figure 11:
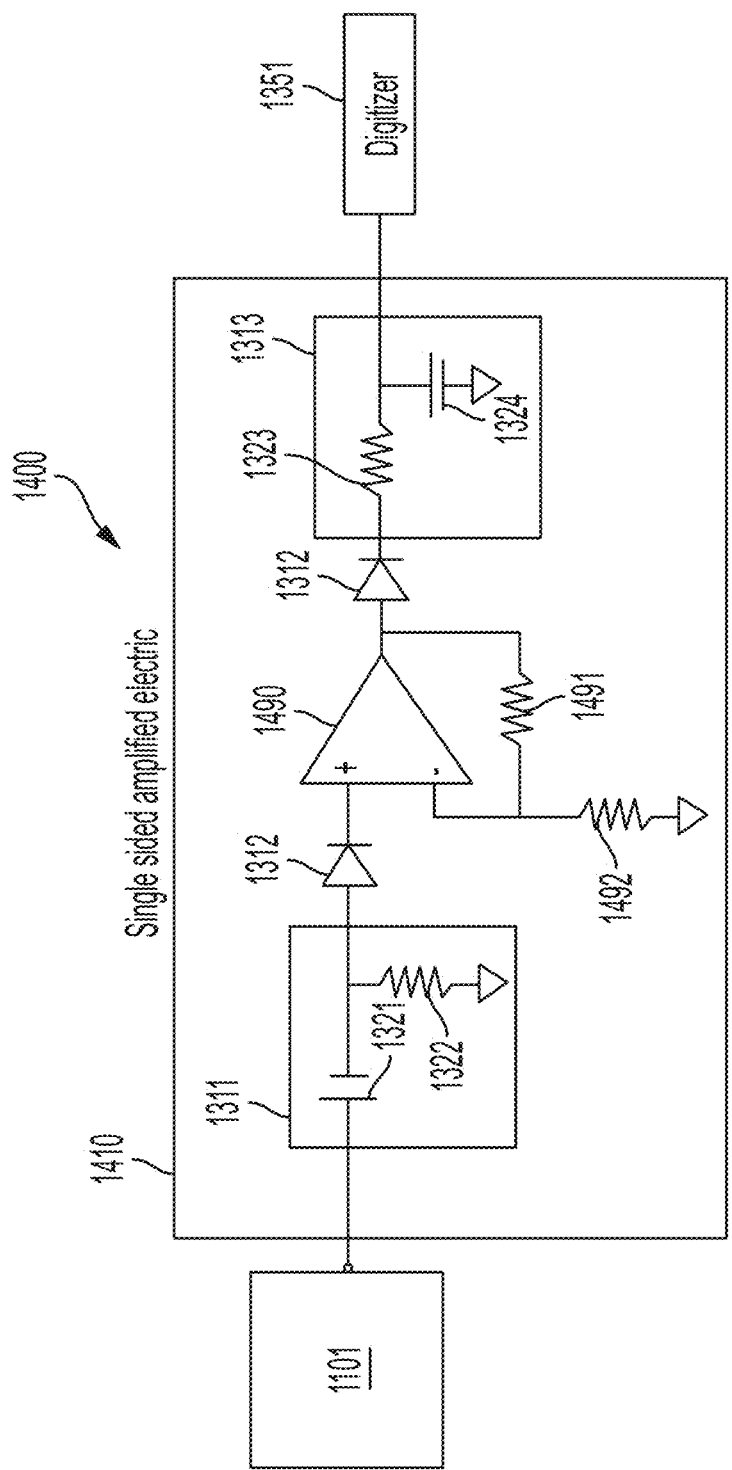
FIG. 11 is a simplified schematic of a PD detection system comprising a single-sided direct amplified electrical envelope generator in accordance with some embodiments.

FIG. 11 is a simplified schematic of a PD detection system 1400 comprising a single-sided direct amplified electrical envelope generator 1410 in accordance with some embodiments. Many of the components of the PD detection system 1400 are similar to those previously discussed in connection with the single-sided direct electrical envelope generator 1310. The PD detection system 1400 includes an amplifier 1490 and biasing resistors 1491, 1492 connected between the high pass filter 1311 and the low pass filter 1313. A rectifier 1312 may optionally be connected between the high pass filter 1311 and the amplifier 1490 and/or between the amplifier 1490 and the low pass filter 1313. The output of the envelope generator 1410 provides an amplified envelope signal which is provided to the digitizer component 1351. The digitized signals produced by the digitizer component 1351 may be provided to a processor (not shown in FIG. 11) that performs further analysis of the PD event as discussed above. In this particular embodiment, an optional separate channel for detecting the operational frequency of the monitored AC system may optionally be included but is not shown.

Figure 12:
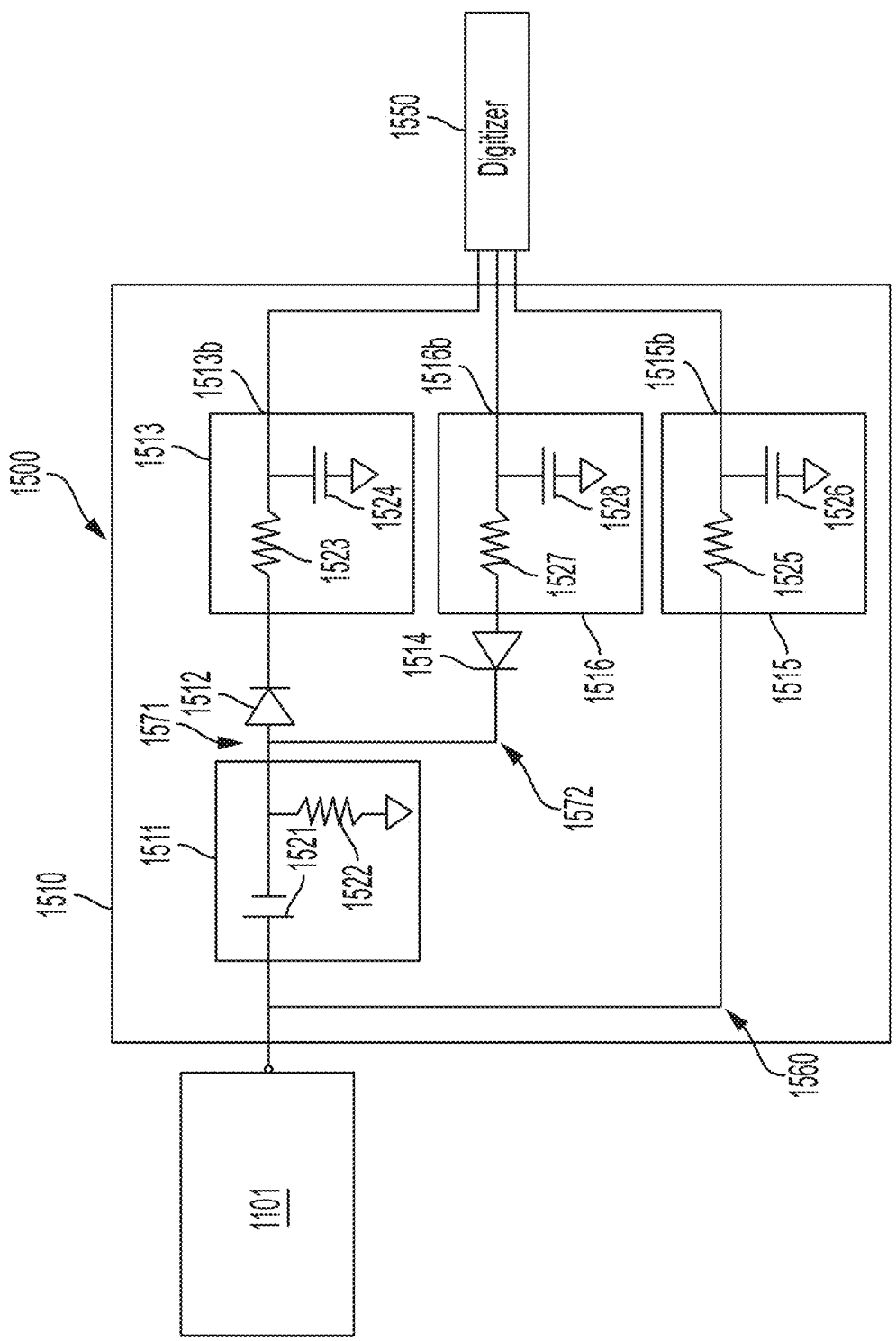
FIG. 12 is a simplified schematic of a PD detection system comprising a double sided direct electrical envelope generator in accordance with some embodiments.

FIG. 12 is a simplified schematic of a PD detection system 1500 comprising a double sided direct electrical envelope generator 1510 in accordance with some embodiments. The PD sensor 1101 provides an electrical signal responsive to a PD event of a monitored electrical system. Envelope generator 1510 includes a high pass filter 1511 represented here as a passive high pass filter comprising capacitor 1521 and resistor 1522. As illustrated in FIG. 12, the envelope generator 1510 includes two electrical channels 1571, 1572 wherein channel 1571 passes the positive-going signal output of the high pass filter 1511 and channel 1572 passes the negative-going signal output of the high pass filter 1511. Rectifier 1512 passes the positive-going high pass filtered signal to low pass filter 1513. Oppositely arranged rectifier 1514 passes the negative-going high pass filtered signal to low pass filter 1516.

Low pass filter 1513 attenuates high frequency components from the positive-going signal, providing the positive-going envelope portion at the output 1513b of the low pass filter 1513. In FIG. 12, the low pass filter 1513 is depicted as a passive filter comprising a capacitor 1524 and a resistor 1523, however it will be appreciated that other types of low pass filter circuits may be used. It is also possible for low-pass circuitry to be built-in to a digitizer, and in some embodiments no extra low-pass filters are required. The positive-going portion of the envelope signal is converted from an analog signal to a digital signal by digitizer 1550.

Low pass filter 1516 attenuates high frequency components from the negative-going signal, providing the negative-going envelope portion at the output 1516b of the low pass filter 1516. In FIG. 12, the low pass filter 1516 is depicted as a passive filter comprising a capacitor 1528 and a resistor 1527, however it will be appreciated that other types of low pass filter circuits may be used. The negative-going portion of the envelope signal is converted from an analog signal to a digital signal by digitizer 1550.

The PD detection system 1500 can optionally include a channel 1560 that detects the operating frequency of a monitored AC electrical system. Channel 1560 includes a low pass filter 1515 that substantially attenuates frequencies that are above, e.g., 10 times, 100 times, 1000 times, the operating frequency while passing frequencies that are below operating frequency of the electrical system. In FIG. 12, the low pass filter 1515 is depicted as a passive filter comprising a capacitor 1526 and a resistor 1525, however it will be appreciated that other types of low pass filter circuits may be used. The output 1515b of the low pass filter 1515 can be converted from an analog signal to a digital signal by digitizer 1550. The output of the digitizer 1550 may be coupled to a processor (not shown in FIG. 12). The processor can be configured to analyze the envelope signal, e.g., as further described in connection with FIG. 8A.

In some embodiments, the cut off frequencies of the high pass filter 1511 and/or low pass filters 1513, 1515, 1516 can be tunable as discussed above.

Figure 13:
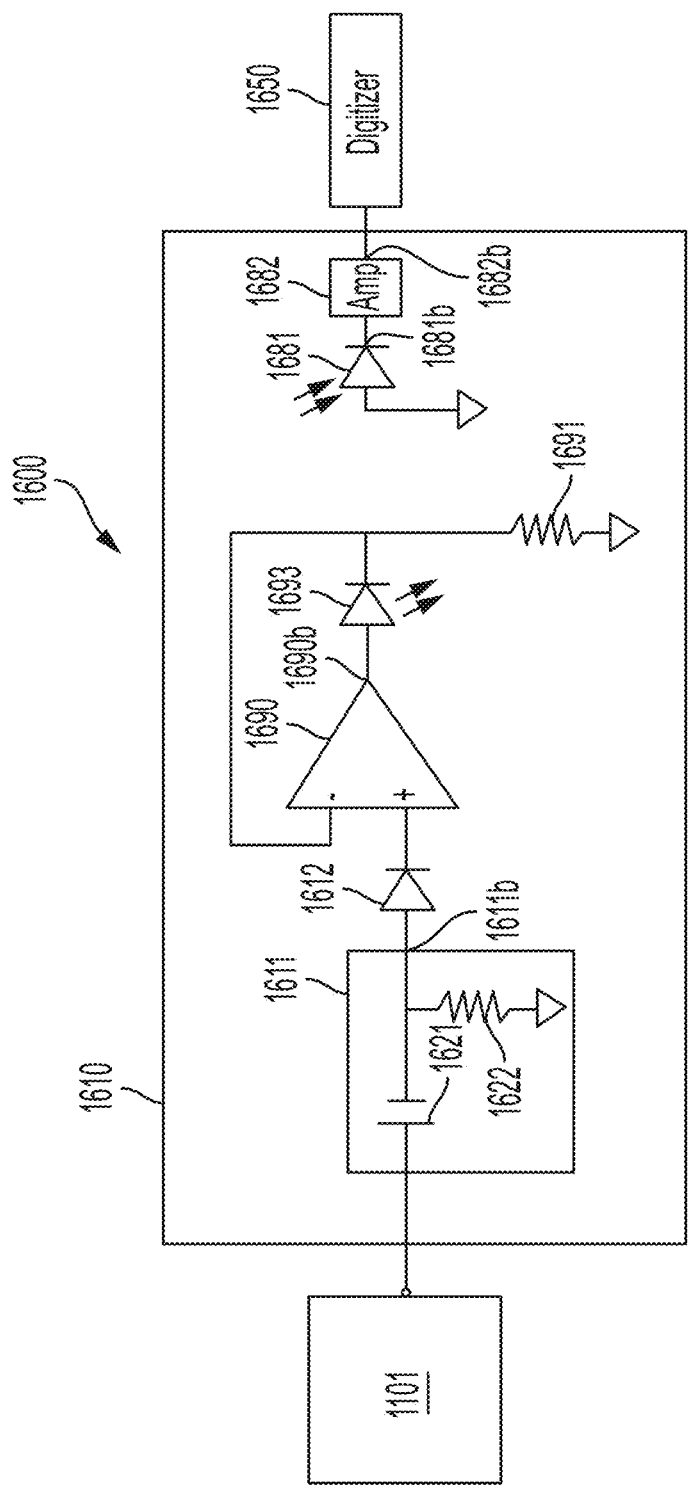
FIG. 13 is a simplified schematic diagram of a PD detection system that includes a single-sided amplified optical envelope generator in accordance with some embodiments.

FIG. 13 is a simplified schematic diagram of a PD detection system 1600 that includes a single-sided amplified optical envelope generator 1610 in accordance with some embodiments. The PD sensor 101 provides an electrical signal responsive to a PD event of a monitored electrical system. Envelope generator 1610 includes a high pass filter 1611 represented here as a passive high pass filter comprising capacitor 1621 and resistor 1622. The high pass filter 1611 may in general comprise any type of high pass filter and may optionally have a tunable cut off frequency as discussed herein.

Rectifier 1612 may optionally be coupled at the output 1611b of the high pass filter 1611 between the high pass filter 1611 and amplifier 1690. Rectifier 1612 passes the positive-going portion of high pass filtered signal. If the high frequency components of the signal at output 1611b exceed the slew rate of the amplifier 1690, the amplified signal at the output of amplifier 1690 may be distorted. In some configurations, the characteristics of rectifier 1612 may be selected such that the slew rate requirements of amplifier 1690 are reduced. For example, the response time (rise and/or fall times) of the rectifier 1612 may be selected to attenuate high frequency components of the signal at output 1611b.

The signal at the output 1690b of amplifier 1690 drives a light emitting diode (LED) 1693 wherein the current through LED 1693 is limited by resistor 1691. Light generated by LED 1693 is detected by photodetector 1681 and is converted to an electrical signal at the photodetector output 1681b. Optionally, amplifier 1682 is included in the envelope generator 1610 to provide a second stage of amplification. The amplified signal at the output 1682b of amplifier 1682 is digitized by digitizer 1650. The digitized signals produced by the digitizer 1650 may be provided to a processor (not shown in FIG. 13) that performs further analysis of the PD event as discussed above.

In various embodiments, low pass filtering of the signal at the output of the photodetector 1681b can be achieved by reducing the bandwidth of the amplifier 1682. The low pass filtering function of the envelope generator 1610 can be provided by the rectifier 1612, the LED 1693, the photodetector 1681 and/or amplifier 1682. The transient input and/or output response characteristics of each, some, or all of these components may provide low pass filtering that produces the envelope signal. In this particular embodiment, an optional separate channel for detecting the operational frequency of the monitored AC system may be included but is not shown.

Figure 14:
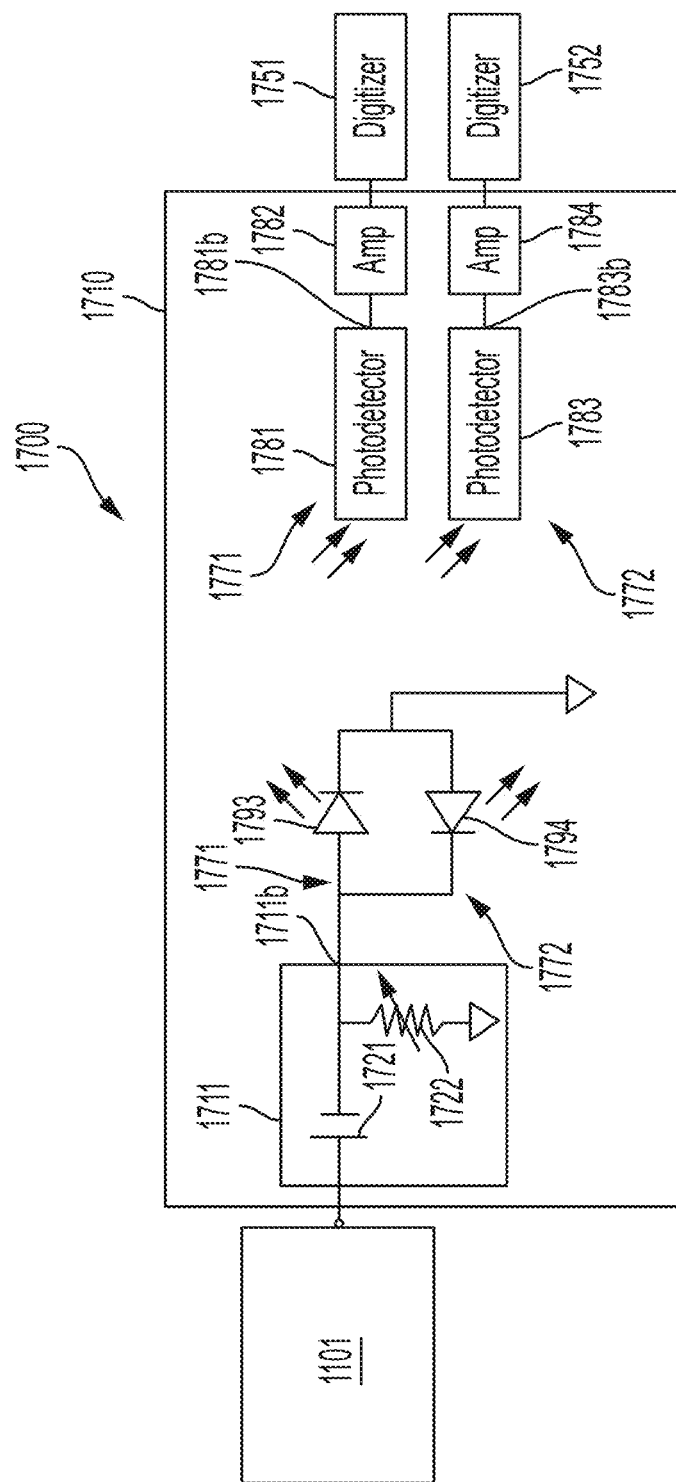
FIG. 14 is a simplified schematic diagram of a PD detection system that includes a double-sided optical envelope generator in accordance with some embodiments.

FIG. 14 is a simplified schematic diagram of a PD detection system 1700 that includes a double-sided optical envelope generator 1710 in accordance with some embodiments. The PD sensor 1101 provides an electrical signal responsive to a PD event of a monitored electrical system. Envelope generator 1710 includes a high pass filter 1711 represented here as a passive high pass filter comprising capacitor 1721 and resistor 1722. The high pass filter 1711 may in general comprise any time of high pass filter and may optionally have a tunable cut off frequency as discussed herein.

The signal at the output 1711b of high pass filter 1711 drives LEDs 1793 and 1794. A first channel 1771 that includes LED 1793 converts the positive-going portion of the signal at the output 1711b to a first light signal. A second channel 1772 that includes LED 1794 converts the negative-going portion of the signal at the high pass filter output 1711b to a second light signal. Photodetector 1781 reconverts the first light signal to an electrical signal at the output 1781b of the photodetector 1781. Photodetector 1783 reconverts the second light signal to an electrical signal at the output 1783b of the photodetector 1783.

Optionally, amplifiers 1782, 1784 are included in the envelope generator 1710. The amplified signals at the outputs 1782b, 1784b are digitized by digitizer components 1751, 1753, respectively. The digitized signals produced by the digitizer components 1751, 1752 may be provided to a processor (not shown in FIG. 14) that performs further analysis of the PD event as discussed above.

In various embodiments, low pass filtering of the envelope generator 1710 in signal channel 1771 can be provided by LED 1793, photodetector 1781 and/or amplifier 1782. The characteristics of each, some, or all of these components, such as bandwidth, transient input response and/or transient output response, may provide low pass filtering that produces the envelope signal. Similarly, in various embodiments, low pass filtering of the envelope generator 1710 in signal channel 1772 can be provided by LED 1794, photodetector 1783 and/or amplifier 1784. The characteristics of each, some, or all of these components, such as bandwidth, transient input response and/or transient output response, may provide low pass filtering that produces the envelope signal. In this particular embodiment, an optional separate channel for detecting the operational frequency of the monitored AC system may be included but is not shown.

Figure 15:
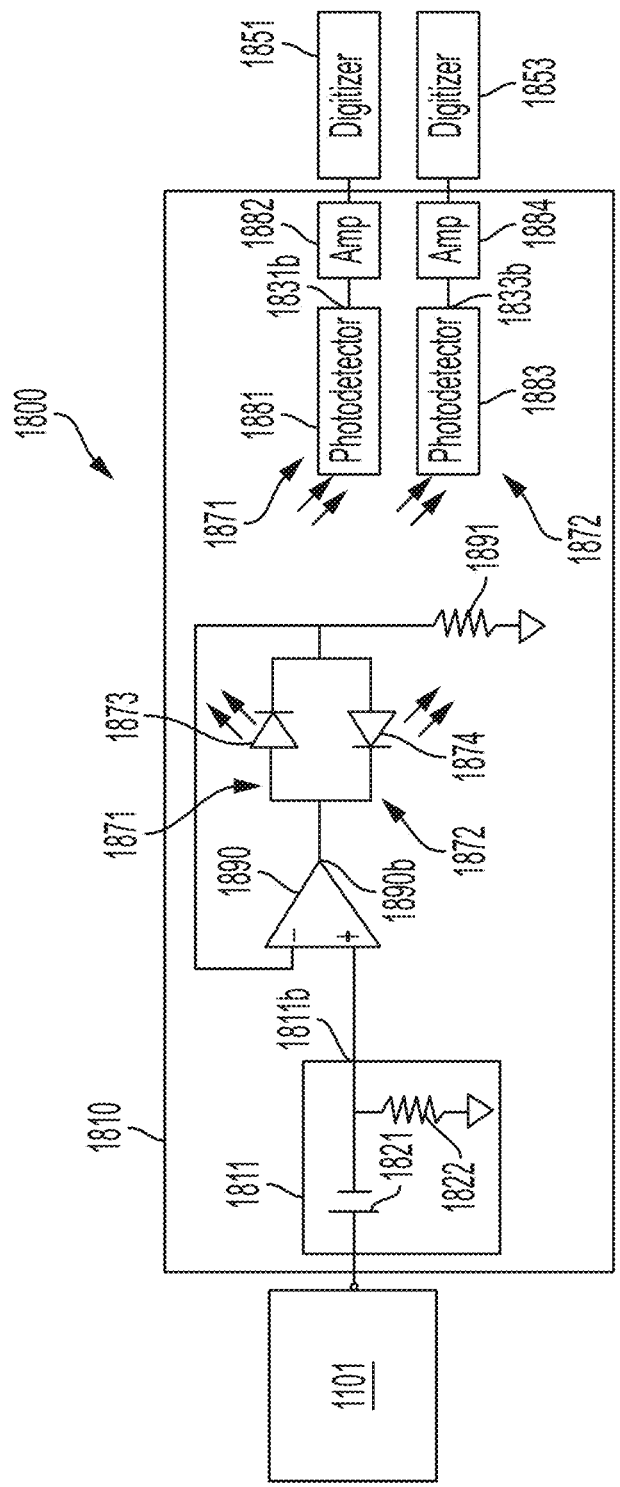
FIG. 15 is a simplified schematic diagram of a PD detection system 1800 that includes a double-sided optical envelope generator 1810 in accordance with some embodiments.

FIG. 15 is a simplified schematic diagram of a PD detection system 1800 that includes a double-sided optical envelope generator 1810 in accordance with some embodiments. Many of the components of the PD detection system 1800 are similar to those previously discussed in connection with the double-sided optical envelope generator 1700. The envelope generator 1810 includes amplifier 1890 connected between the high pass filter 1811 comprising capacitor 1821 and resistor 1822 and LEDs 1893, 1894. Although shown as a passive analog filter, the high pass filter 1811 may in general be any type of filter. In some embodiments, the high pass filter is tunable as discussed above. Resistor 1891 is included to limit the current through LEDs 1893 and 1894. LED 1873 in channel 1871 converts the positive-going portion of the signal at the output 1890b of amplifier 1890 to a first light signal. LED 1874 in channel 1772 passes the negative-going portion of the signal at the output 1890b of amplifier 1890 to a second light signal.

The first light signal is reconverted to an electrical signal at the output 1881b of photodetector 1881. The second light signal is reconverted to an electrical signal at the output 1883b of the photodetector 1883.

Optionally, amplifiers 1882, 1884 are included in the envelope generator 1810. The amplified signals at the outputs 1882b, 1884b are digitized by digitizer components 1851, 1853, respectively. The digitized signals produced by the digitizer components 1851, 1853 may be provided to a processor (not shown in FIG. 15) that performs further analysis of the PD event as discussed above.

In various embodiments, low pass filtering of the envelope generator 1810 in signal channel 1871 can be provided by LED 1873, photodetector 1881 and/or amplifier 1882. The characteristics of each, some, or all of these components, such as bandwidth, transient input response and/or transient output response, may provide low pass filtering that produces the envelope signal. Similarly, in various embodiments, low pass filtering of the envelope generator 1810 in signal channel 1872 can be provided by LED 1874, photodetector 1883 and/or amplifier 1884. The characteristics of each, some, or all of these components, such as bandwidth, transient input response and/or transient output response, may provide low pass filtering that produces the envelope signal. In this particular embodiment, an optional separate channel for detecting the operational frequency of the monitored AC system may be included but is not shown.

Example

Figure 7:
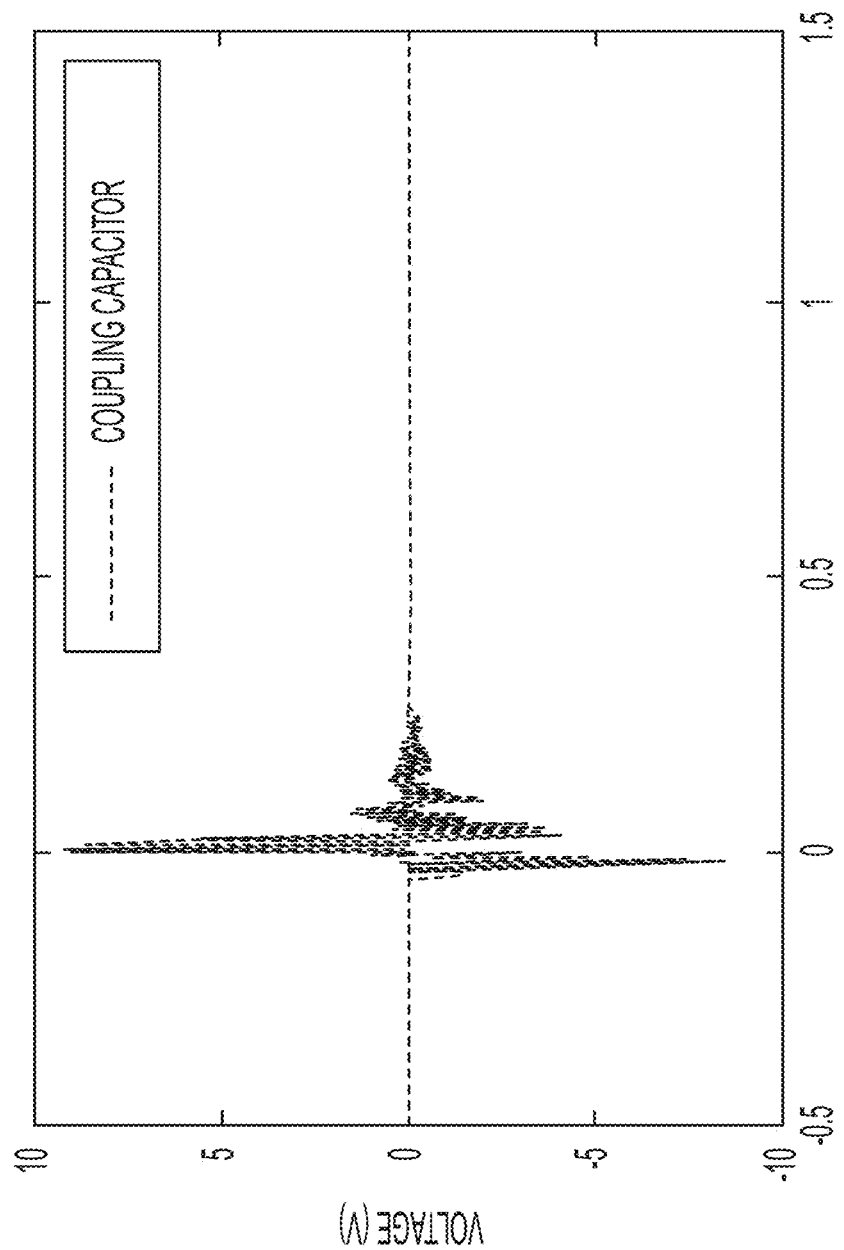
FIG. 7 is a graph of the voltage across a coupling capacitor during a PD event.

A test using a 110 V-7000 V potential transformer was performed to demonstrate the PD transducer as discussed herein. A capacitive coupler using the PD transducer circuit shown in FIG. 2 was tested. Internal partial discharges were generated by running the transformer in air at 90 VAC applied. FIG. 7 is a graph of the voltage across the coupling capacitor during a PD event. In FIG. 7, the voltage graphs of multiple PD events are overlaid.

Figure 16A:
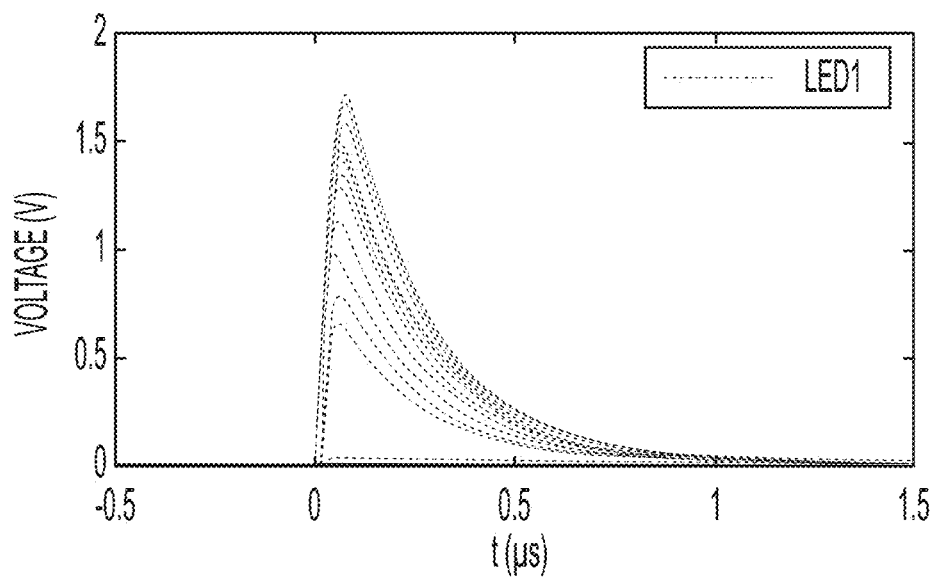
FIG. 16A is a graph of the voltage signal output of the transimpedance amplifier that represents the light signal from a first LED of an electrical optical transducer in accordance with some embodiments.
Figure 16B:
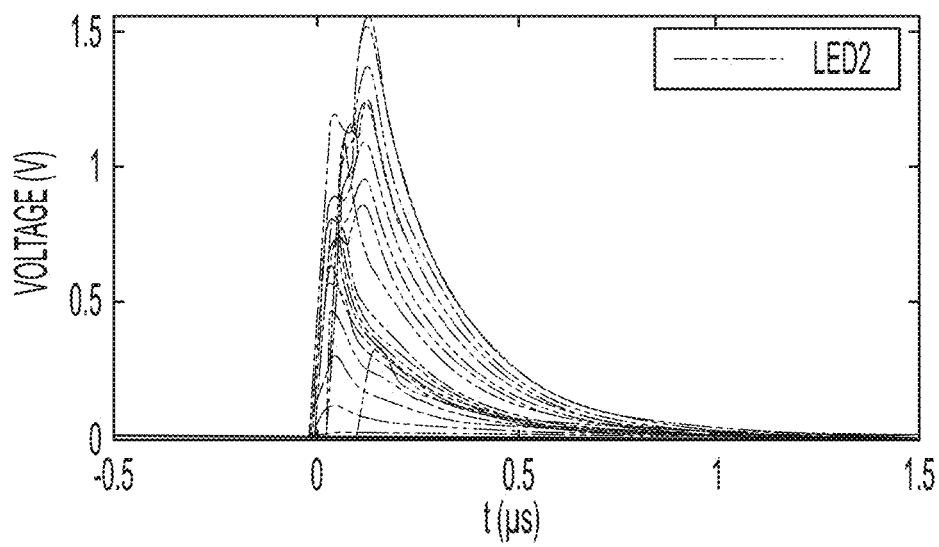
FIG. 16B is a graph of the voltage signal output of the transimpedance amplifier that represents the light signal from the second LED of an electrical optical transducer in accordance with some embodiments.

The light signals of the first and second transducer LEDs (elements 512 and 514 in FIG. 2) were converted to electrical signals using first and second silicon photomultiplier detectors. The outputs of the first and second photomultiplier detectors were amplified by first and second transimpedance amplifiers. FIG. 16A is a graph of the voltage signal output of the transimpedance amplifier that represents the light signal from the first LED, where the different traces represent different PD events. FIG. 16B is a graph of the voltage signal output of the transimpedance amplifier that represents the light signal from the second LED. The LEDs used in the PD transducer of this example had 500 μec response times, thus the fast oscillations of the signal from the capacitive couplers were not present in the voltage signals shown in FIGS. 16A and 16B.

Figure 17A:
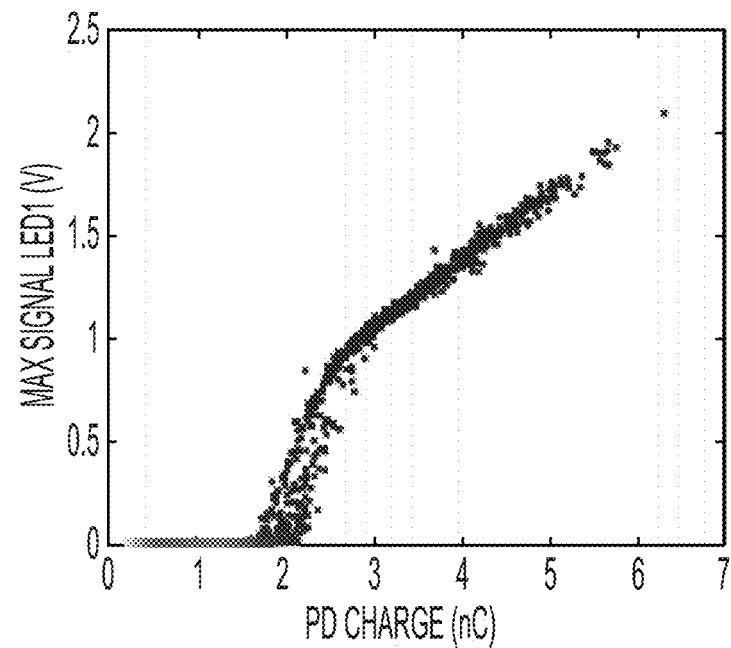
FIG. 17A shows a comparison of the voltage signal representing the light signal from the first LED to the maximum signal from the capacitive PD sensor.
Figure 17B:
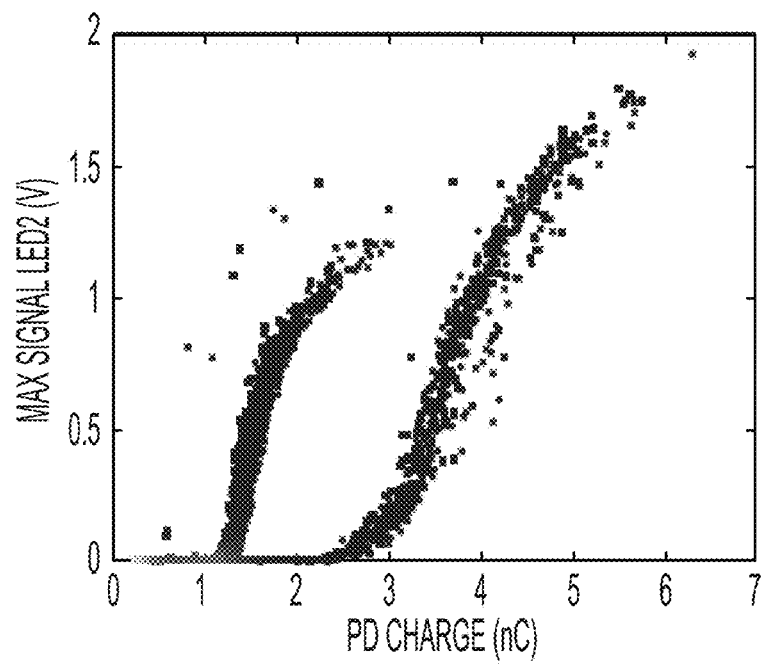
FIG. 17B shows a comparison the voltage signal representing the light signal from the second LED to the maximum signal from the capacitive PD sensor.

FIG. 17A shows a comparison the voltage signal representing the light signal from the first LED (component 512 in FIG. 2) to the maximum signal (PD charge) from the capacitive PD sensor (element 411 in FIG. 2). FIG. 17B shows a comparison the voltage signal representing the light signal from the second LED (component 514 in FIG. 2) to the maximum signal (PD charge) from the capacitive PD sensor (component 411 in FIG. 2). From these comparisons, it is noted that the PD charge of the capacitive PD sensor is correlated to the voltage signals representing the light signals of the first and second LEDs.

Figure 18:
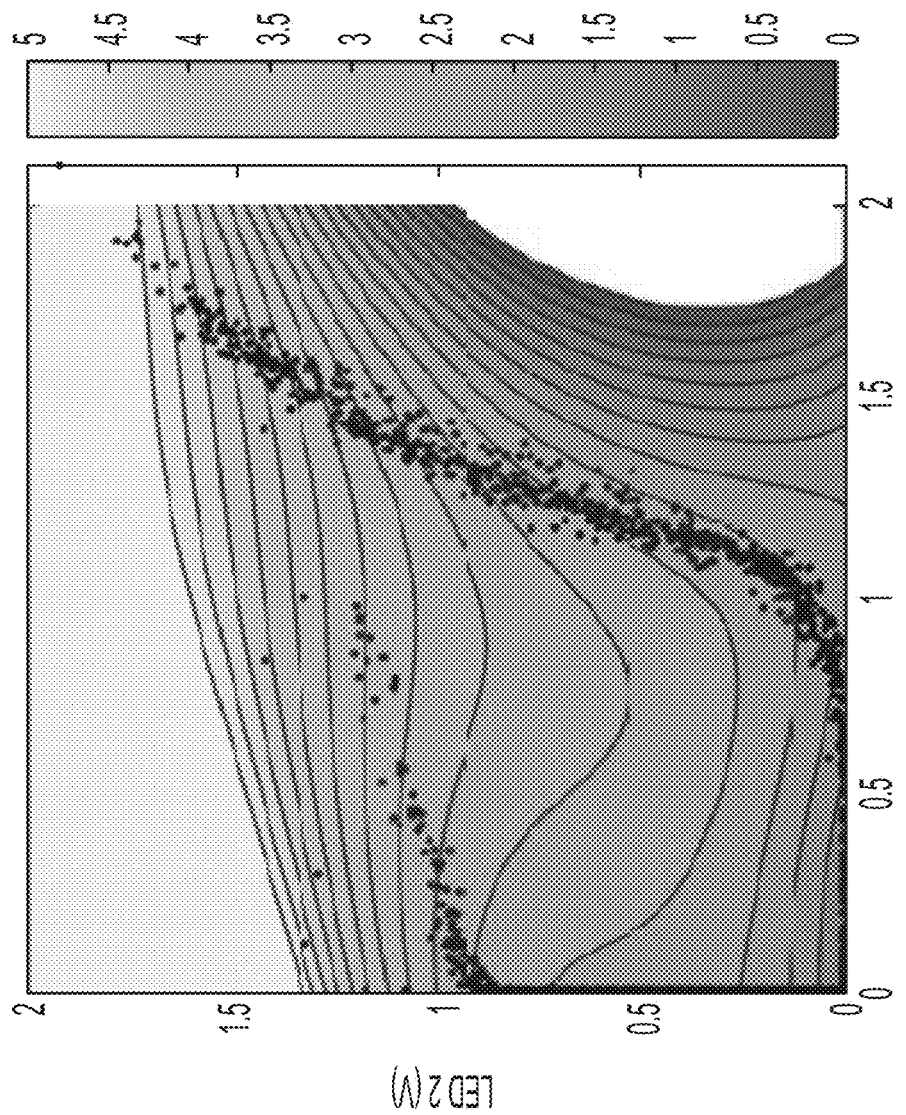
FIG. 18 shows a polynomial surface used to fit a model that predicts the partial discharge charge amplitude based on the voltage signal from the two LEDs in accordance with some embodiments.
Figure 19:
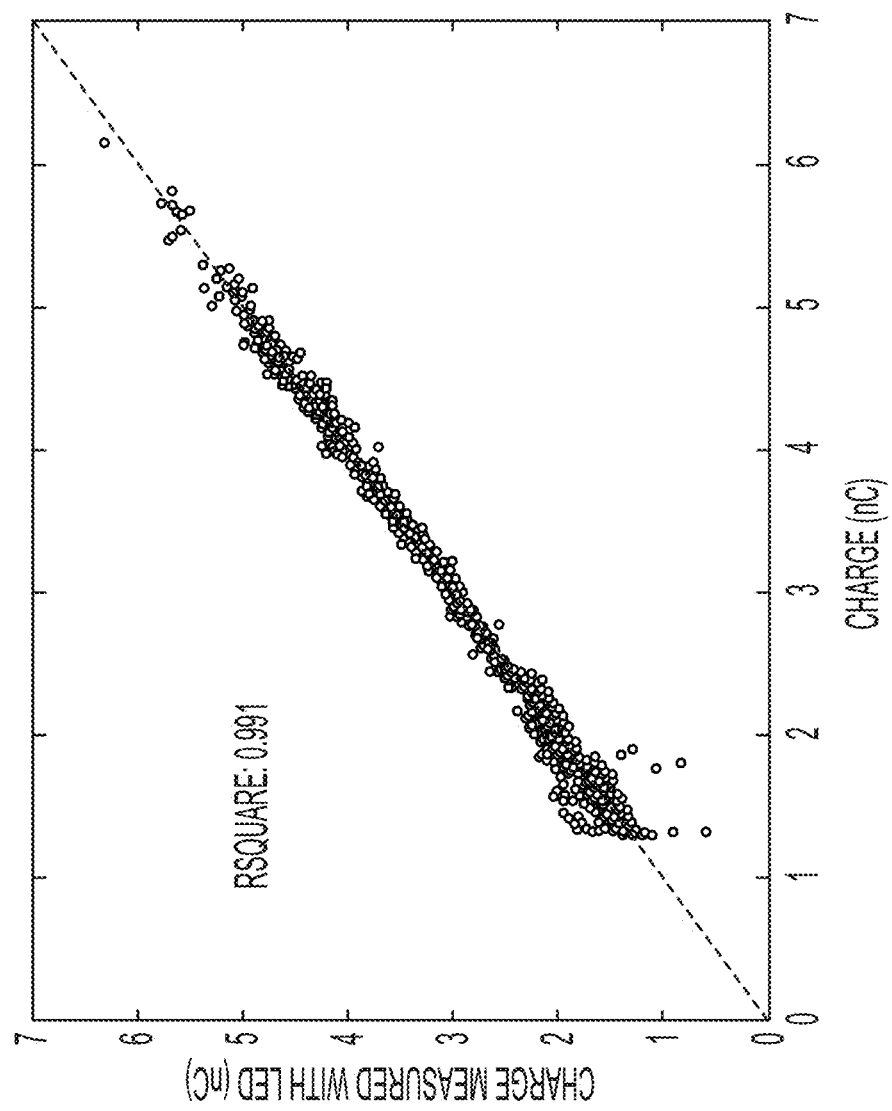
FIG. 19 shows the comparison of the predicted PD charge using the model to the measured PD charge using the capacitive PD sensor in accordance with some embodiments.

A polynomial surface, shown in FIG. 18, was used to fit a model that predicts the partial discharge charge amplitude based on the voltage signal from the two LEDs. FIG. 19 shows the comparison of the predicted PD charge using the model to the measured PD charge using the capacitive PD sensor. The comparison represented in FIG. 19 shows that the electrical—optical PD transducer as in FIG. 2 can provide an accurate measurement of PD having a magnitude larger than 1 nC.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A partial discharge detection system, comprising:
a partial discharge (PD) sensor configured to sense a PD event of an electrical system and to generate a sensor signal in response to the PD event; and
an envelope generator coupled to receive the sensor signal from the PD sensor, the envelope generator configured to extract an envelope signal of the sensor signal; and
a digitizer configured to convert the envelope signal to a digital representation of the PD event, wherein a bandwidth of the digitizer is less than a highest frequency component of the sensor signal and the digitizer bandwidth is less than about 10 MHz.

2. The partial discharge system of claim 1, wherein the PD sensor comprises one or more of a coupling capacitor, a transient earth voltage sensor, a current transformer, and an antenna.

3. The partial discharge system of claim 1, wherein the envelope generator is configured to extract the envelope signal of a positive or a negative-going portion of the sensor signal.

4. The partial discharge system of claim 1, wherein the envelope generator is configured to extract the envelope signal of both a positive and a negative-going portion of the sensor signal.

5. The partial discharge system of claim 1, wherein the envelope generator comprises at least one amplifier configured to amplify the envelope signal.

6. The partial discharge system of claim 5, wherein the envelope generator comprises a diode coupled to an input of the amplifier and configured to reduce a slew rate requirement of the amplifier.

7. The partial discharge system of claim 1, where the envelope signal is an electrical signal.

8. The partial discharge system of claim 1, wherein the envelope signal is an optical signal.

9. The partial discharge system of claim 1, wherein the envelope generator comprises at least one or both of a high pass filter and a low pass filter.

10. The partial discharge system of claim 9, wherein a cut off frequency of at least one of the high pass filter and the low pass filter is tunable.

11. The partial discharge system of claim 9, wherein the envelope generator comprises an amplifier having characteristics that provide the low pass filter.

12. The partial discharge system of claim 9, wherein:
the envelope generator comprises a light emitting diode (LED) configured to convert the sensor signal to an optical signal; and
the LED is configured to provide the low pass filter.

13. The partial discharge system of claim 9, wherein:
the envelope signal is an optical signal and the envelope generator comprises a photodetector configured to convert the optical envelope signal to an electrical signal; and
the photodetector is configured to provide the low pass filter.

14. The partial discharge system of claim 1, wherein the envelope generator comprises at least one diode configured to substantially block a positive-going or a negative-going portion of the sensor signal.

15. The partial discharge system of claim 1, further comprising a low frequency path configured to detect a base frequency of the electrical system.

16. A method, comprising:
sensing a partial discharge (PD) event of an electrical system;
generating an electrical sensor signal in response to the PD event;
extracting an envelope signal from the sensor signal; and
converting, using a digitizer, the envelope signal to a digital representation of the envelope signal, wherein a bandwidth of the digitizer is less than a highest frequency component of the electrical sensor signal and the digitizer bandwidth is less than about 10 MHz.

17. The method of claim 16 wherein extracting the envelope signal comprises one or both of high pass filtering and low pass filtering the sensor signal.

18. The method of claim 16, wherein extracting the envelope signal comprises extracting an optical envelope signal.

19. The partial discharge system of claim 1, wherein the bandwidth of the digitizer is less than about ⅕ the highest frequency component of the sensor signal.

20. The partial discharge system of claim 1, wherein the partial discharge (PD) sensor comprises one or more of a coupling capacitor, a transient earth voltage sensor, and a current transformer.

21. The method of claim 16, wherein the bandwidth of the digitizer is less than about ⅕ the highest frequency component of the electrical sensor signal.

22. The method of claim 16, wherein sensing the partial discharge (PD) event comprises sensing the PD event using a PD sensor comprising one or more of a coupling capacitor, a transient earth voltage sensor, and a current transformer.

23. The partial discharge system of claim 1, wherein the bandwidth of the digitizer is less than about 1/10 of the highest frequency component of the sensor signal.

24. The method of claim 16, wherein the bandwidth of the digitizer is less than about 1/10 of the highest frequency component of the sensor signal.

* * * * *